US008188373B2

(12) United States Patent
Hunrath

(10) Patent No.: US 8,188,373 B2
(45) Date of Patent: May 29, 2012

(54) INSULATING LAYER FOR RIGID PRINTED CIRCUIT BOARDS

(75) Inventor: Christopher A. Hunrath, San Juan Capistrano, CA (US)

(73) Assignee: Integral Technology, Inc., Lake Forest, CA (US)

( * ) Notice: Subject to any disclaimer, the term of this patent is extended or adjusted under 35 U.S.C. 154(b) by 703 days.

(21) Appl. No.: 12/329,488

(22) Filed: Dec. 5, 2008

(65) Prior Publication Data

US 2009/0151989 A1 Jun. 18, 2009

Related U.S. Application Data

(60) Provisional application No. 61/012,392, filed on Dec. 7, 2007, provisional application No. 61/016,292, filed on Dec. 21, 2007, provisional application No. 61/078,315, filed on Jul. 3, 2008.

(51) Int. Cl.
*H05K 1/09* (2006.01)

(52) U.S. Cl. ........................................ 174/257

(58) Field of Classification Search .................. 174/257
See application file for complete search history.

(56) References Cited

U.S. PATENT DOCUMENTS

| | | | | |
|---|---|---|---|---|
| 4,858,073 | A | 8/1989 | Gregory | |
| 5,072,074 | A | 12/1991 | DeMaso et al. | |
| 5,084,124 | A | 1/1992 | Taniguchi | |
| 5,097,390 | A | 3/1992 | Gerrie et al. | |
| 5,206,463 | A | 4/1993 | DeMaso et al. | |
| 5,214,571 | A | 5/1993 | Dahlgren et al. | |
| 5,234,522 | A | 8/1993 | Suzuki et al. | |
| 5,538,789 | A | 7/1996 | Capote et al. | |
| 5,565,267 | A | 10/1996 | Capote et al. | |
| 5,591,519 | A | 1/1997 | Caron et al. | |
| 5,601,905 | A | 2/1997 | Watanabe et al. | |
| 5,637,382 | A | 6/1997 | Kataoka et al. | |
| 5,723,205 | A | 3/1998 | Millette et al. | |
| 5,901,041 | A | 5/1999 | Davies et al. | |
| 5,925,206 | A | 7/1999 | Boyko et al. | |
| 6,048,430 | A | 4/2000 | Johnston | |
| 6,159,611 | A | 12/2000 | Lee et al. | |
| 6,261,467 | B1 | 7/2001 | Giri et al. | |
| 6,809,260 | B1 | 10/2004 | Prokofiev | |
| 7,018,704 | B2 | 3/2006 | Kaneshiro et al. | |
| 2005/0064222 | A1 | 3/2005 | Russell | |
| 2005/0281995 | A1 | 12/2005 | Murai et al. | |
| 2007/0090894 | A1 | 4/2007 | Phan et al. | |
| 2008/0032103 | A1 * | 2/2008 | Kikuchi et al. | 428/214 |

FOREIGN PATENT DOCUMENTS

| | | | |
|---|---|---|---|
| CN | 1756654 | A | 4/2006 |
| JP | 03-049291 | | 3/1991 |
| JP | 09-148695 | | 6/1997 |
| JP | 09-283895 | | 10/1997 |

OTHER PUBLICATIONS

International Search Report and Written Opinion in PCT Application No. PCT/US2008/013378; Dated Mar. 27, 2009 in 14 pages.

* cited by examiner

*Primary Examiner* — Chau Nguyen

(74) *Attorney, Agent, or Firm* — Knobbe, Martens, Olson & Bear, LLP

(57) ABSTRACT

One or more embodiments contained herein disclose rigid printed circuit boards (PCBs) and methods for manufacturing the same comprising strain resistant layers configured to, among others, minimize defects from occurring in cap layers of the PCBs.

22 Claims, 10 Drawing Sheets

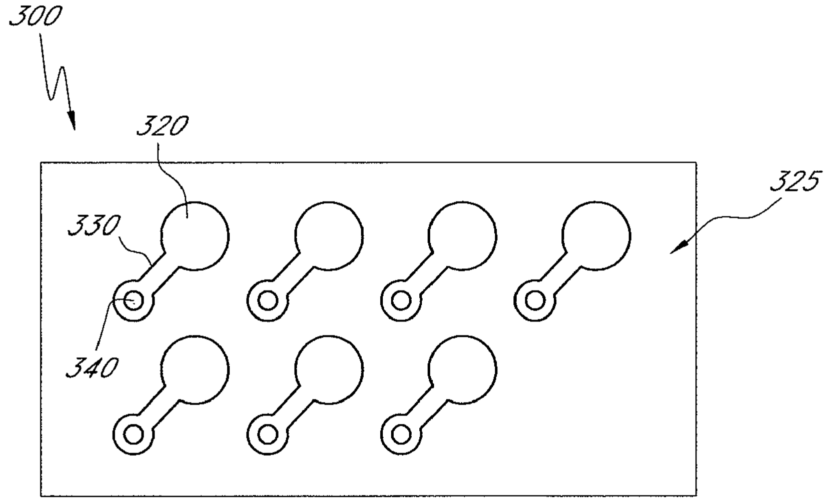
FIG. 3A
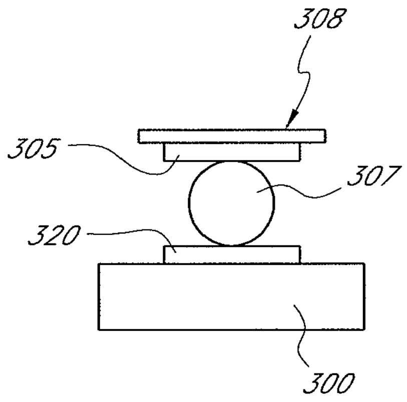
FIG. 3B
FIG. 3C
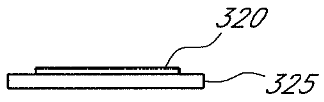
FIG. 3D
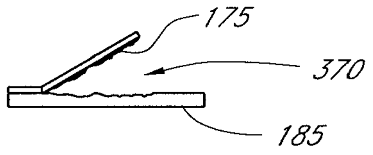
FIG. 3E
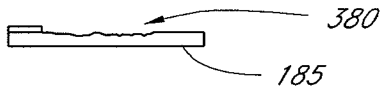

| Property | Units | Strain Resistant Layer Comprising Polyimide | FR-4 | High-Temp FR-4 |
|---|---|---|---|---|
| CTE X,Y (below Tg) | ppm/°C | 19 | 14 | 16 |
| CTE X,Y (above Tg) | ppm/°C | 20-42 | 140 | 45 |
| Tg | °C | 220-420 | 170 | 180 |
| Decomposition Temperature Td | °C | 450 | <300 | 350 |
| Ductility | % | 15-80 | <5 | <5 |
| Tensile Strength | psi | 10,000-50,000** | 70,000-90,000* | 70,000-90,000* |
| Dielectric Constant (at 1MHz) | | 3.4 | 4.6 | 4.7 |
| Dissipation Factor (at 1MHz) | | 0.002 | 0.023 | 0.035 |
| Electric Strength | kV/cm | 1930-2760 | 394 | 532 |
| Copper Peel | lb/in | 6-10 | 2-6 | 2-7 |

Unit Description ppm parts per million

°C °Celsius

% elongation length/original length

MHz $10^6$ Hertz kV $10^3$ Volts cm $10^{-3}$ meters lb pounds in inches

* 0.2032 millimeters (mm) thick material

* * 0.0254 mm thick material

*FIG. 8*

| Expansion | Strain Resistant Layer Comprising Polyimide | | FR-4 | | High-Temp FR-4 | |
|---|---|---|---|---|---|---|
| | in | mm | in | mm | in | mm |
| 20 °C to Tg | 0.003705 | 0.000941 | 0.002100 | 0.000533 | 0.002560 | 0.000650 |
| Tg to Leaded Solder Reflow (215 °C) | 0.000000 | 0.000000 | 0.006300 | 0.001600 | 0.001575 | 0.000400 |
| Tg to Lead-Free Solder Reflow (245 °C) | 0.001000 | 0.000254 | 0.010500 | 0.002667 | 0.002925 | 0.000743 |
| Total (Leaded Solder) | 0.003705 | 0.000941 | 0.008400 | 0.002134 | 0.004135 | 0.001050 |
| Total (Lead-Free Solder) | 0.004705 | 0.001195 | 0.012600 | 0.003200 | 0.005485 | 0.001393 |

| Unit Description | |
|---|---|
| in | inch |
| mm | millimeter |

*FIG. 9*

INSULATING LAYER FOR RIGID PRINTED CIRCUIT BOARDS

CROSS-REFERENCES TO RELATED APPLICATIONS

The present patent application claims the priority benefit of U.S. Provisional Application No. 61/012,392, which was filed on Dec. 7, 2007. This patent application also claims the priority benefit of U.S. Provisional Application No. 61/016,292, filed on Dec. 21, 2007, and U.S. Provisional Application No. 61/078,315, filed on Jul. 3, 2008, the disclosures of both of which are hereby expressly incorporated by reference in their entirety.

BACKGROUND

1. Field

The disclosure herein relates to printed circuit boards, and more particularly, insulating layers for use with rigid printed circuit boards.

2. Description of the Related Art

Printed circuit boards (PCB) comprise one or more layers of electrically conductive material such as copper and one or more electrically insulating layers such as dielectrics. Multilayer PCBs typically comprise two or more inner and/or surface conductive layers formed over and separated by a plurality of insulating layers with holes, vias, and through holes providing electrical connection between the various inner conductive layers and other inner conductive layers and/or the surface conductive layers.

Several aspects of the PCB manufacturing and assembly processes subject PCB components to strain or stress (e.g., mechanical, thermal, physical, chemical, and the like). For example, manufacturing exposes PCBs to a range of temperatures, including high soldering temperatures which have increased even more in response to the industry's recent adoption of lead-free processes. Strain can cause defects in components, resulting in electrical and/or mechanical failure. For example, thermal strain arising from increasing temperatures can cause cracks in the PCB components, including pad cratering, a type of crack typically occurring in insulating layers that engage surface conductive layers. Various embodiments disclosed herein contemplate certain more stable and damage-resistant PCB components for use with rigid PCBs that may substantially increase the yield of rigid PCBs while possibly reducing defects such as voids and cracks and increasing the structural integrity of the rigid PCBs and portions of rigid PCBs such as junctions between insulating layers and surface conductive layers.

SUMMARY

In an embodiment, a device for mounting electrical components comprises: a printed circuit board comprising: a surface conductive layer configured to interface with the electrical components; a strain resistant cap layer configured to engage the surface conductive layer, wherein the strain resistant cap layer comprises polyimide; and one or more rigid insulating layers, wherein at least one of the one or more rigid insulating layers extends throughout the entire length of the printed circuit board such that the entire printed circuit board defines a rigid printed circuit board.

In accordance with some embodiments, a method of manufacturing printed circuit boards comprises: providing a component comprising a first surface of a strain resistant cap layer engaging a first surface of a conductive layer, wherein the strain resistant cap layer comprises polyimide; and attaching the component a stack of laminates by attaching a second surface of the strain resistant cap layer to a top surface of a first layer of the stack of laminates, wherein the stack of laminates comprises at least one rigid insulating layer extending throughout the entire length of the printed circuit board to define the printed circuit board comprising entirely rigid portions.

In certain embodiments, a component for manufacturing rigid printed circuit boards comprises a conductive layer comprising a first surface and a second surface; a discardable layer comprising a first surface, wherein the first surface of the discardable layer is attached to the first surface of the conductive layer; and a strain resistant layer comprising a first surface, wherein the first surface of the strain resistant layer is attached to the second surface of the conductive layer, and wherein the strain resistant layer comprises at least two characteristics selected from a group of: ductility of at least about 15%, Tg of at least about 220° C., and tensile strength of at least about 10,000 psi.

In some embodiments, a printed circuit board comprises: a surface conductive layer configured to interface with the electrical components, wherein the surface conductive layer comprises rolled-annealed copper; a strain resistant cap layer configured to engage the surface conductive layer, wherein the strain resistant cap layer comprises polyimide; and one or more rigid insulating layers, wherein at least one of the one or more rigid insulating layers extends throughout the entire length of the printed circuit board such that the printed circuit board defines a rigid printed circuit board.

In some embodiments, a rigid circuit board comprises a surface conductive layer engaging a strain resistant cap layer. In an embodiment, a component for manufacturing printed circuit boards such as rigid printed circuit boards comprises a surface copper layer and a strain resistant layer, wherein the strain resistant layer comprises polyimide. In a certain embodiment, a rigid PCB comprises one or more strain resistant layers. Further still, the printed circuit board in one embodiment comprises: a surface conductive layer configured to interface with the electrical components, wherein the surface conductive layer comprises rolled-annealed copper; a strain resistant cap layer configured to engage the surface conductive layer, wherein the strain resistant cap layer comprises ductility of at least 15% and tensile strength of at least 10,000 psi; and one or more rigid insulating layers, wherein at least one of the one or more rigid insulating layers extends throughout the entire length of the printed circuit board such that the printed circuit board defines a rigid printed circuit board.

BRIEF DESCRIPTION OF THE DRAWINGS

These and other features will now be described with reference to the drawings summarized below. These drawings and the associated description are provided to illustrate one or more embodiments described in the present patent application and not to limit the scope of the disclosed embodiments.

FIG. 3A illustrates a printed circuit board comprising ball grid array (BGA) packaging.

FIG. 3B is a cross sectional view of an electrical component mounted on a printed circuit board to form a printed circuit board assembly.

FIG. 3C illustrates an embodiment of a printed circuit board showing a cap layer engaging a surface conductive layer.

FIG. 3D illustrates an embodiment of a printed circuit board showing a cap layer comprising a defect engaging a surface conductive layer.

FIG. 3E illustrates an embodiment of a printed circuit board showing a cap layer comprising another defect engaging a surface conductive layer.

FIG. 8 is a table listing material characteristics for example strain resistant materials and other insulating materials.

FIG. 9 is a table comparing expansion characteristics of example strain resistant materials and other dielectric materials.

DETAILED DESCRIPTION

Figure 1:
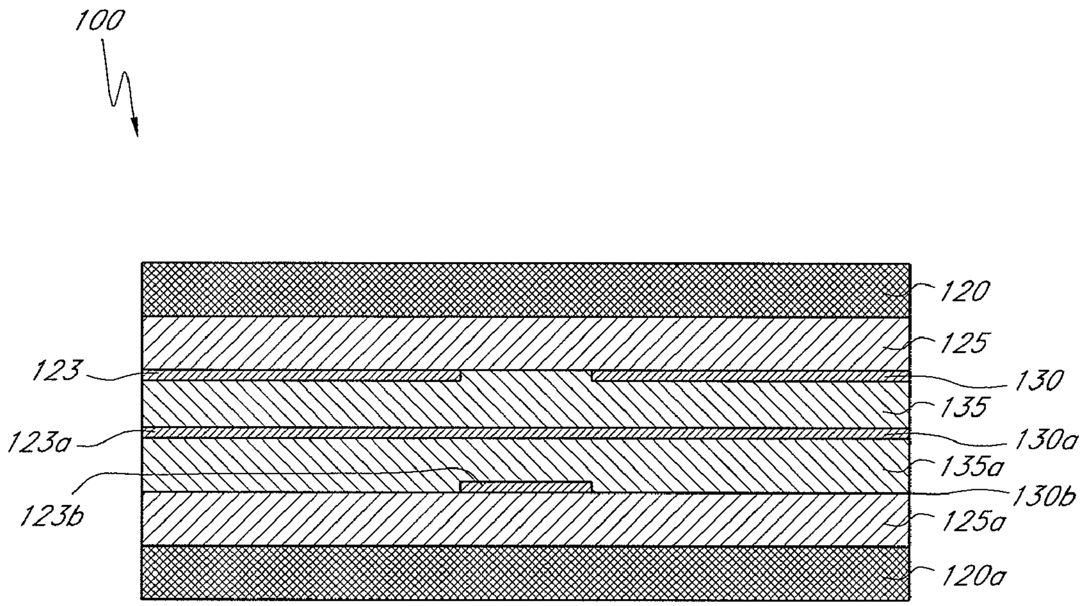
FIG. 1 depicts an embodiment of a multilayer printed circuit board.

In describing various embodiments in the present application, reference will be made herein to FIGS. 1-10B of the drawings, in which like numerals refer to like features unless indicated otherwise.

A. General Description of Non-Limiting Embodiments

The terms "printed circuit boards," "PCBs," and "electrical interconnect systems," as used in the present patent application, are interchangeable and are broadly defined and comprise, without limitation, any and all systems that provide, among others, mechanical support to electrical components, electrical connection to and between these electrical components, combinations thereof, and the like. PCBs comprise systems that generally include a base platform to support the electrical components (for example, a thin board of insulating material) and conductors such as conductive pathways, surfaces, solderable attachments, and the like to provide an electrical interconnection between the electrical components. PCBs can employ a broad range of technologies to support the electrical components (for example, through-hole, surface-mount, mixed-technology, components mounted on one or both sides, etc.) and can comprise a wide range of single or multilayer constructions (for example, single-sided, double-sided, multilayer, flexible, rigid-flex, stripline, etc). The various embodiments herein can apply to PCBs existing at any stage of the PCB manufacturing process, including, by way of non-limiting examples, partially incomplete PCBs lacking one or more PCB components typically present in more complete PCBs such as, for example, insulating layers, conductive circuit patterns, conductive plates, via holes, and the like. As used throughout this application, the term "rigid PCB" includes its standard meaning in the industry and also defines PCBs having no bendable portions. As defined herein, "partially rigid PCBs" broadly refers to interconnect systems comprising at least some rigid and non-bendable portions. Layers belonging to the rigid and non-bendable portions of rigid or partially rigid PCBs can be at least substantially coplanar and may lie in the same plane (e.g., horizontal plane, vertical planes, planes therebetween, etc.) and can be configured to maintain a coplanar structure in operation. PCBs and rigid PCBs can comprise one or more rigid insulating layers. "PCB assembly" broadly refers to printed circuit board systems on which electrical components are partially, substantially, or fully mounted (e.g., electrically attached or connected).

The terms "insulating layer," "dielectric layer," and "dielectric substrate" are broadly interpreted herein, are interchangeable, include their standard meaning in the industry, and describe nonconductive PCB layers generally configured to resist or substantially resist the flow of electricity and to provide physical support for, among others, conductive layers and electrical components. The term "rigid" as used in connection with PCB insulating layers (e.g., rigid insulating layers, rigid dielectrics, etc.) is broadly defined and describes insulating layers comprising ordinary "rigid materials" including, without limitation, materials that are typically non-bendable and reinforced with fiberglass, papers, cotton fabric, asbestos sheet, glass in various forms such as cloth and continuous filament mat, ceramic material, molybdenum, various types of plastics, etc. Several other rigid materials or mixes of rigid materials can be used to produce rigid insulating layers, including prepregs (short for preimpregnated) such as, for example, flame retardant (FR) 2 (cellulose paper impregnated with phenolic resin), FR-3 (cotton paper impregnated with epoxy), FR-4 (epoxy-resin impregnated woven glass cloth), FR-5 (woven glass impregnated with epoxy), etc. Rigid layers comprise rigid materials generally used to manufacture rigid PCBs or rigid portions of partially rigid PCBs.

As used herein, "strain resistant layers" is defined broadly and refers to insulating layers for manufacturing printed circuit boards, including rigid and partially rigid PCBs, comprising, among others, one or more characteristics that can endure more strain (e.g., mechanical, thermal, physical, chemical, and the like) and/or can be more stable (e.g., thermally, chemically, physically, etc) than ordinary insulating layers, including rigid insulating layers as described herein. Strain resistant layers comprise a broadly defined array of "strain resistant materials," including, without limitation, thermosetting and/or thermoplastic plastics, such as, for example, polyimide, polyester, fluorinated hydrocarbon, polymers, polyacrylate, liquid crystal polymer, synthetic fibers, aramids, fluorocarbons, etc. Strain resistant layers can also comprise a mixture of one or more of the thermosetting and/or thermoplastic plastic materials or a mixture of one or more of the plastic materials with other materials (e.g., fillers, hardeners, etc.).

"Cap layer," as used herein, is broadly defined and describes dielectric substrates and insulating layers that interface with or engage the outermost conductive layers, also referred to herein as "surface conductive layers," such as, for example, surface copper pads. "Surface conductive layer," "outer conductive layer," or "surface layer" used in connection with PCB conductive layers broadly refer to the outermost conductive layers of PCBs, such as, for example, surface copper layers and etched surface conductive pads generally configured to engage electrical devices mounted on the PCBs, such as, for example, electrical components. "Electronic" or "electrical" components broadly describe any PCB-mountable device capable of handling electricity for which PCBs are designed to provide, among others, physical support and/or electrical connection and without limitation include electrical devices, electronic devices, electronic circuits, electrical elements, integrated circuits, hybrid systems, and the like.

The term "layer" as used in this application implies a position in the cross section (profile) of PCBs or components of PCBs. A layer in a PCB may be continuous or discontinuous, and may or may not be planar or substantially planar. For example, a PCB may comprise an inner or outer conductive discontinuous layer such as an etched printed circuit layer. As used in relation to one PCB layer in connection with another PCB layer, the terms "engage" or "attach" or "over" (e.g., as in one layer over another layer) are broadly defined to describe a layer or portions of the layer directly or indirectly connected or attached to another layer or portions of the other layer. Non-limiting examples of an indirect connection include, for example, a layer in a PCB connected or attached to another layer through an intermediate layer, such as, for example, a mask, a coating layer, a thin film, soldering material, and the like. Similarly, "forming," "depositing," "positioning," or "providing," as used herein in connection with creating or positioning one layer over or on another layer, generally disclose arranging or creating PCB layers such that at least portions of one layer are directly or indirectly engaging at least portions of the other layer. A rigid layer "extending" throughout the entire length of the PCB defines a layer generally provided over the length of the PCB (e.g., may or may not be continuous, may or may not have same boundaries with the PCB, etc.) such that the PCB is a rigid PCB.

As used herein, the terms "pre-form" or "pre-forming" PCB layer components or layers to be used with PCBs define a discontinuity between manufacturing the components and manufacturing PCBs using the pre-formed components such that the component manufacturing and the PCB manufacturing qualify as "independent manufacturing processes." A non-limiting example of independent manufacturing processes includes manufacturing PCBs using a component manufactured by an entity different from the entity manufacturing the PCBs, such as, without limitation, 3$^{rd}$ parties (e.g., original equipment manufacturers, distributors, wholesalers, discount sellers, suppliers, retailers, etc.), affiliates, subsidiaries, parent entities, licensors/licensees, other legally different entities, combinations thereof, and the like. PCB "manufacturing" is broadly defined herein and includes all stages of the PCB manufacturing and assembly process, including, for example, preparing or obtaining materials to make PCB layers, providing at least a first PCB layer, processing one or more PCB layers to form circuit patterns separated by insulating layers, assembling a PCB by mounting an electrical component onto a partially, substantially or fully completed PCB, testing a PCB assembly package comprising electric devices mounted thereon, etc. Various embodiments herein describing manufacturing rigid PCBs are also applicable to manufacturing rigid portions of partially rigid PCBs.

Referring now to FIG. 1, an embodiment of a multilayer printed circuit board (PCB) 100 is illustrated. The PCB 100 comprises first and second conductive outer or surface layers 120, 120*a*, first and second insulating layers 125, 125*a*, first, second, and third conductive inner layers 130, 130*a*, 130*b*, and first and second insulating inner layers 135, 135*a*. The first and second insulating layers 125, 125*a* of FIG. 1 engage the first and second surface conductive layers 120, 120*a* and, therefore, are cap layers. The conductive inner layers 130, 130*a*, 130*b* can be etched to form first, second, and third circuit patterns 123, 123*a*, 123*b*.

As illustrated in FIG. 1, the first surface conductive layer 120 is over the first insulating layer 125 and the first insulating layer 125 is provided over the top surface of the first circuit pattern 123. The first circuit pattern 123*a* is over the top surface of the first insulating inner layer 135, the latter of which is positioned over the second circuit pattern 123*b*, which in turn is over the top surface of the second insulating inner layer 135*a*. As shown in FIG. 1, the third circuit pattern 123*b* is over the top surface of the second insulating layer 125*a* and the second insulating layer 125*a* is provided over the second surface conductive layer 120*a*.

The surface conductive layers 120, 120*a* and/or the circuit patterns 123, 123*a*, 123*b* can comprise any suitable conductive metals, such as, for example, copper, gold, aluminum, nickel, kovar, steel, resistance alloys, etc. PCB conductive layers are typically made of thin copper foil. As shown in FIG. 1, at least one of the insulating layers 125, 125*a* and/or the insulating inner layers 135, 135*a* comprises an ordinary insulating layer comprising a wide array of rigid materials such as epoxy resin, FR-3, FR-4, etc. In certain embodiments, at least one of the insulating layers 125, 125*a* and/or the insulating inner layers 135, 135*a* comprising rigid material is substantially coplanar with at least one of the surface conductive layers 120, 120*a* such that the PCB 100 is a rigid PCB. In certain embodiments, the at least one of the insulating layers 125, 125*a* and/or the insulating inner layers 135, 135*a* comprising rigid material is substantially coextensive (e.g., cross sectional length) with at least one of the surface conductive layers 120, 120*a*. In various embodiments, the PCB 100 comprises at least one rigid insulating layer (e.g., the first and second insulating layers 125, 125*a*, the first and second insulating inner layers 135, 135*a*, or another insulating layer not shown) extending through the entire length of the PCB 100 such that the PCB 100 is a rigid PCB. Dielectric materials, including the insulating layers 125, 125*a* and the insulating inner layers 135, 135*a* can be selected based on properties such as, for example, thermal stability, dielectric constant, flexibility, tensile strength, and dimensional stability.

Figure 2:
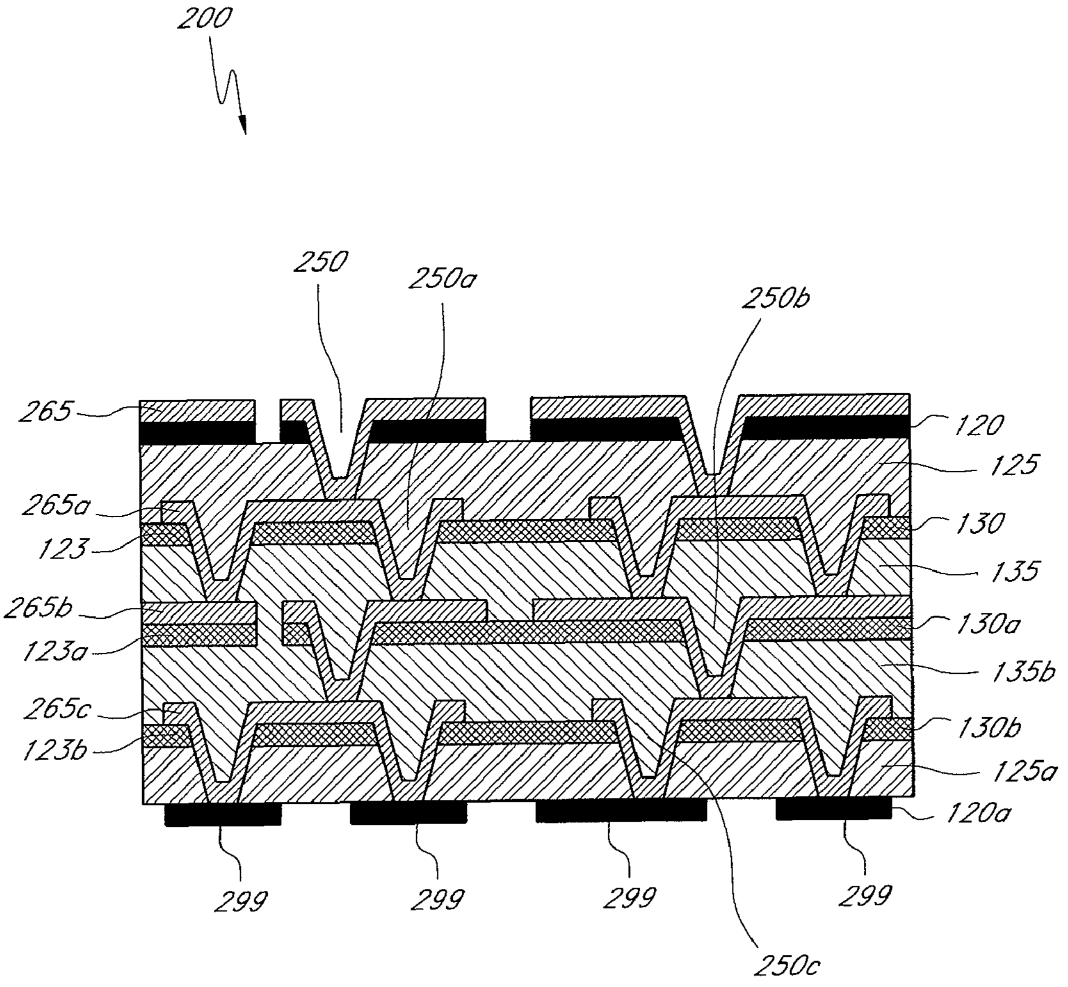
FIG. 2 illustrates another embodiment of a multilayer printed circuit board comprising via holes and conductive plates.

FIG. 2 illustrates another embodiment of a multilayer PCB 200 disclosing the PCB 100 of FIG. 1 further comprising first, second, third, and fourth levels of via holes 250, 250*a*, 250*b*, 250*c* and conductive plates 265, 265*a*, 265*b*, 265*c*. The via holes 250, 250*a*, 250*b*, 250*c* and the conductive plates 265, 265*a*, 265*b*, 265*c*, the latter being at least partially over some portions of the via holes 250, 250*a*, 250*b*, 250*c*, the surface conductive layers 120, 120*a*, and the circuit patterns 123, 123*a*, 123*b*, generally are configured to electrically connect various conductive layers of the PCB 200, as will be discussed below.

As illustrated in FIG. 2, the first level via holes 250 are shown penetrating the first surface conductive layer 120 and the first insulating layer 125. In FIG. 2, the first layer via holes 250 and some portions of the first surface conductive layer 120 are coated with the conductive plate 265. The first level via holes 250 and the conductive plate 265 connect some portions of the surface conductive layer 120 with some portions of the first conductive inner layer 130. The second layer of via holes 250*a* are shown penetrating the first conductive inner layer 130 and the first insulating inner layer 135. The second layer via holes 250*a* and some portions of the first conductive inner layer 130 are coated with the conductive plate 265*a*. The second layer via holes 250*a* and the conductive plate 265*a* connect some portions of the first conductive inner layer 130 with some portions of the second conductive inner layer 130*a*.

Still with reference to FIG. 2, the third layer of via holes 250*b* are shown penetrating the second conductive inner layer

130*a* and the second insulating inner layer 135*b*. The third layer via holes 250*b* and some portions of the second conductive inner layer 130*a* are coated with the conductive plate 265*b* and connect some portions of the second conductive inner layer 130*a* with some portions of the third conductive inner layer 130*b*. The fourth layer via holes 250*c* penetrate the third conductive inner layer 130*b* and the second insulating layer 125*a*. The fourth layer via holes 250*c* and portions of the third conductive inner layer 130*b* are coated with the conductive plate 265*c* and connect some portions of the third conductive inner layer 130*b* with some portions of the second surface conductive layer 120*a*. In some embodiments, the first surface conductive layer 120, the second surface conductive layer 120*a*, or both the first and second surface conductive layers 120, 120*a* are etched to create pads 299, for example, to electrically connect an electrical component such as a semiconductor chip (not shown) with the PCB 200.

As shown in FIGS. 1 and 2, the PCB 100 and the PCB 200 are provided as non-limiting illustrative embodiments and although the figures show PCBs comprising four insulating layers (the first and second insulating layers 125, 125*a* and the first and second insulating inner layers 135, 135*a*) and five conductive layers (the first and second surface conductive layers 120, 120*a* and the first, second, and third circuit patterns 123, 123*a*, 123*b*) arranged in the configurations disclosed therein, the various embodiments and features disclosed throughout this application can be used in connection with PCBs comprising a different number (for example, more or fewer than five conductive layers and/or four insulating layers) and a different arrangement of conductive and/or insulating layers. For example, although the via holes 250, 250*a*, 250*b*, 250*c* of PCB 200 penetrate only a single layer of electrically conductive layer and a single layer of insulating layer, the via holes 250, 250*a*, 250*b*, 250*c* in other embodiments can be configured to comprise varying lengths penetrating more or fewer layers. In one embodiment, a solder resist layer can be further deposited on the top surface of one or both of the outer most conductive layers 120, 120*a*. In some embodiments, as least some of the via holes 250, 250*a*, 250*b*, 250*c* can be at least partially filled with solder resist material. In certain embodiments, the PCB 200 can comprise one or more through-holes penetrating one or more of the layers of the PCB 200 to accommodate insertion of electrical component leads. In some embodiments, at least one of the first and second insulating layers 125, 125*a* or the first and second insulating inner layers 135, 135*a* comprises rigid material. In certain embodiments, portions of the at least one of the first and second insulating layers 125, 125*a* or the first and second insulating inner layers 135, 135*a* comprising rigid material are coplanar with some portions of the at least one of the surface conductive layers 120, 120*a* such that the PCB 200 comprises at least some rigid portions comprising the rigid portions of a partially rigid PCB. In certain embodiments, substantial portions of the at least one of the first and second insulating layers 125, 125*a* or the first and second insulating inner layers 135, 135*a* comprising rigid material are coplanar with the at least one of the surface conductive layers 120, 120*a* such that the PCB 400 is a rigid PCB. In various embodiments, the PCB 400 comprises at least one rigid insulating layer (e.g., the first and second insulating layers 125, 125*a*, the first and second insulating inner layers 135, 135*a*, or another insulating layer not shown) extending through the entire length of the PCB 400 such that the PCB 400 is a rigid PCB. In some embodiments, the PCB 400 comprises a plurality of rigid insulating layers, some of which extend substantially less than the entire length of the PCB 400 (e.g., half, a third, etc.), arranged in a manner such that the combination of the plurality of rigid insulating layers makes the PCB 400 a rigid PCB (e.g., a rigid insulating layer extending roughly through half the length of the PCB 400, another rigid layer extending roughly through the remaining half, etc.).

FIGS. 3A-3E include depictions of various embodiments illustrating an example defect that can be caused by, among others, the strain (e.g., thermal strain) put on PCBs during the manufacturing process. FIG. 3A is a top plan view of the top surface 325 of a PCB 300 comprising, for example, one or more of the PCBs 200 of FIG. 2. The top surface 325 has thereon a simplified dog bone design comprising conductive pads 320, plated via holes 340, and connectors 330. The PCB 300 comprises a ball grid array (BGA) mounting technology wherein the array of conductive pads 320 are configured to connect to corresponding conductive pads of surface mountable electrical components (not shown) to electrically attach or mount the electrical components with the PCB 300. In some embodiments, the PCB 300 can be configured to comprise different electrical component packaging technologies such as, without limitation, Dual In-line Packaging (DIP), Pin Grid Array (PGA), Leadless Chip Carrier (LCC), Flip-chip BGA (FCBGA), Plastic Quad Flat Pack (PQFP), Small-Outline Integrated Circuit (SOIC), Plastic Leaded Chip Carrier (PLCC), System in Package (SIS), combinations thereof, and the like.

FIG. 3B shows a cross-section view of portions of an electrical component 308, soldering material 307, and a portion of the PCB 300 of FIG. 3A. A conductive chip pad 305 is attached to the electrical component 308. For simplicity, the PCB 300 of FIG. 3B shows only one of the conductive pads 320 attached to the PCB 300 of FIG. 3A. As shown in FIG. 3B, the conductive chip pad 305 of the electrical component 308 can be electrically connected to the conductive pad 320 of the PCB 300 using the soldering material 307. The assembly can be heated, for example using a reflow oven or an infrared heater, to melt the solder ball 307 and to thereby mechanically couple the electrical component 308 with the PCB 300. Once coupled, the electrical component 308 and the PCB 300 are electrically connected, and electric signals from the conductive pad 320 can flow to the electrical component 308 through the soldering material 307 and the electrically conductive chip pad 305.

During the manufacturing of PCBs, an electrical component assembly process, or normal operation of PCBs, cracks can occur on one or more layers of the PCBs. One cause of such cracks is the considerable thermal stress (e.g., including mechanical stress arising from changes in temperature) to which PCBs are subjected, for example, during the manufacturing process including heating of the soldering material. Various materials used in the assembly processes, such as insulating layers, conductive layers, soldering metals, and electrical components can have different coefficients of thermal expansion (CTE), potentially causing these materials to expand and contract at different rates in response to changes in temperature. As such, thermal stress during the PCB assembly process can arise from mismatches in CTE, both between the electrical components, including soldering material, and the PCB boards onto which the electrical components are mounted, and between the different materials which make up the PCB. In the case of a type of crack called pad cratering, thermal mismatch or Coefficient of Thermal Expansion (CTE) mismatch, for example between cap layers and surface conductive layers, can cause a defect such as a crack in the cap layers as the cap layers and the surface conductive layers respond (e.g., expand or contract) to temperature changes at unequal rates. For example, when heat is applied to soldering material 307, CTE mismatch between the conductive pad 320 and portions of the cap layer underneath the conductive pad 320 can cause portions of the cap layers to move relative to the conductive pad 320 (e.g., opposite direction), separating some portions of the cap layer from the conductive pad 320. Pad cratering can cause portions of the PCB to be separated or fall off, resulting in mechanical failure in the PCB, or can create a defect in the flow of electricity in the PCB, causing an electrical failure. In certain embodiments, thermal stress can cause the conductive pads 320 to partially, substantially, or fully separate from the underlying cap layer. The at least partially separated conductive pads 320 can remove portions of the cap layer still attached to portions of the at least partially separated conductive pads 320, thereby creating holes or craters the cap layer from which the at least partially separated conductive pads 320 separate. Strain such as thermal strain can also cause a defect by applying stress to the junction connecting the cap layer and the conductive pad 320 without forming a crack in the cap layer to potentially cause intermittent or thermally sensitive electrical or mechanical failures.

Still with reference to 3B, the recent trend of using lead-free PCB manufacturing processes including lead-free soldering has exacerbated pad cratering. The leading lead-free alloys used in the PCB assembly process such as tin, bismuth, copper, various proprietary mixtures of some of these alloys, and/or other materials have higher melting points than lead-based soldering material, necessitating the use of higher temperatures to melt the soldering material 307 to couple, for example, the semiconductor electrical component 308 and the PCB 300. As CTEs are a function of temperature, the application of higher temperatures to the various layers of the PCB 300 and the electrical component 308 can put even more strain on the PCB 300, the various layers of the PCB 300 (e.g., between insulating and conductive layers), the electrical component 308, and the various layers of the electrical component 308 by increasing differences due to thermal expansion, thereby increasing thermal stress.

Still with reference to 3B, the PCB 300 can also be subjected to more mechanical strain, including during the manufacturing process, as a result of rising manufacturing temperatures. The use of increasing reflow-soldering temperatures can correspondingly increase the hardness of insulating layers, including cap layers, making these insulating layers more brittle and more susceptible to mechanical stress. Further, the leading non-lead based soldering materials typically have harder and stiffer properties than lead-based soldering materials and, therefore, can generate higher mechanical forces on the conductive pads 320 or insulating layers of the PCB 300 including the cap layers engaging the conductive pads 320. Alone or in combination, these factors can increase the frequency of cracks, including pad cratering, that can occur in insulating cap layers engaging the conductive pads 320. In certain embodiments, strain as described herein applies stress to junctions connecting insulating layers and conductive layers, causing defects in the connection (e.g., sever partially or completely, undermine connectivity, etc.) creating electrical or mechanical failures.

FIGS. 3C-3E illustrate an embodiment of pad cratering that can occur, for example, in an insulating layer 325 positioned below surface conductive layers of PCBs, including, for example, the conductive pad 320 of FIG. 3B. Although the pad cratering embodied in FIGS. 3C-3E is shown as occurring in the insulating layer 325 underneath the conductive pad 320 of FIG. 3B, FIGS. 3C-3E illustrate only one embodiment and cracks can occur in different layers, including, without limitation, the insulating inner layers 135, 135*a* of FIG. 2, and in insulating layers engaging different conductive layers, such as, without limitation, the conductive inner layers 130, 130*a*, 130*b*. FIG. 3C shows the conductive pad 320 and the insulating layer 325 (for example, the first insulating layer 125 of FIG. 2) engaging the conductive pad 320 under normal circumstances. FIG. 3D shows the connection between the conductive pad 320 and the insulating layer 325, wherein the insulating layer 325 is beginning to form a crack 370 (pad cratering) as a result of the strain exerted onto the conductive pad 320. As can be seen in FIG. 3D, the crater 370 separates at least one end of the insulating layer 325 into top portion 175 and bottom portion 185. FIG. 3E illustrates a more substantial pad cratering 380 wherein the top portion 175 of the insulating layer 325 is separated from the bottom portion 185, likely causing failure in the PCB 300 or portions of the PCB 300.

B. Detailed Descriptions of Non-Limiting Embodiments

Methods and systems for use with manufacturing, assembling, and using PCBs, including rigid and partially rigid PCBs, comprising more stable (e.g., thermally, mechanically, physically, etc.) strain resistant layers to resist damage that can arise from strain and/or stress (e.g., mechanical, thermal, physical, and the like) will now be described with reference to the accompanying drawings.

Figure 4:
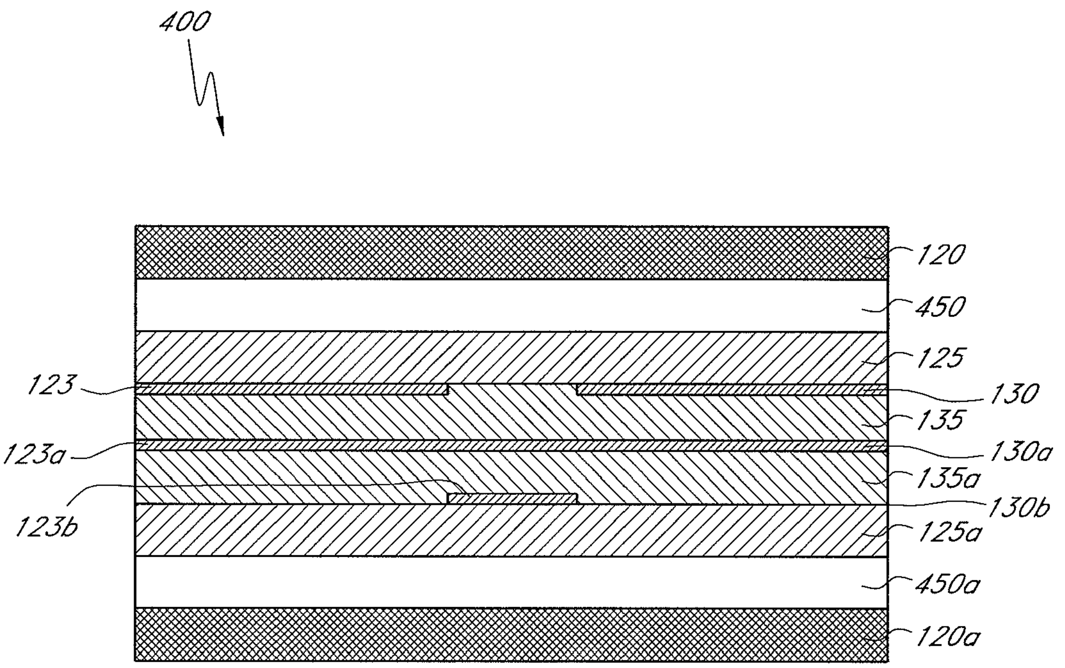
FIG. 4 illustrates an embodiment of a printed circuit board comprising strain resistant layers.

FIG. 4 illustrates a multilayer PCB 400 comprising the PCB 100 of FIG. 1 and further comprising first and second strain resistant layers 450, 450*a*. The first surface conductive layer 120 is over the first strain resistant layer 450, the latter of which is over the first insulating layer 125. The top surface of the first strain resistant layer 450 engages the first surface conductive layer 120 and the bottom surface of the first strain resistant layer 450 engages the first insulating layer 125. The second strain resistant layer 450*a* is over the second surface conductive layer 120*a* and the second insulating inner layer 125*a* is over the second strain resistant layer 450*a*. The second strain resistant layer 450*a* is between the second surface conductive layer 120*a* and the second insulating layer 125*a* and the first strain resistant layer 450 is between the first surface conductive layer 120. The bottom surface of the second strain resistant layer 450*a* engages the second surface conductive layer 120*a* and the top surface of the second strain resistant layer 450*a* engages the second insulating layer 125*a*. In some embodiments, a pre-formed laminate component comprising the first strain resistant layer 450 engaging the first surface conductive layer 120 or a pre-formed laminate component comprising the second strain resistant layer 450*a* engaging the second surface conductive layer 450*b* can be used to manufacture the PCB 400 by attaching the pre-formed laminate component to the remaining layers of the PCB 400 (e.g., the first or second insulating layers 125, 125*a*).

In some embodiments, the strain resistant layers 450, 450*a* comprise suitable commercially available materials, such as, for example, Kapton® polyimide film, available from E. I. du Pont de Nemours and Company (DuPont). In certain embodiments, the PCB 400 comprises pre-formed layers of the first strain resistant layer 450 engaging the first surface conductive layer 120 and/or the second strain resistant layer 450*a* engaging the second surface conductive layer 450*b*. In some embodiments, the PCB 400 comprises commercially available pre-formed components of conductive and strain resistant layers such as, for example, R/Flex 1000® available from Rogers Corporation and Pyralux® LF, Pyralux® AC, Pyralux® FR, available from DuPont, and the like.

In FIG. 4, the PCB 400 comprises the strain resistant layers 450, 450*a*, the surface conductive layers 120, 120*a*, the insulating layers 125, 125*a*, the conductive inner layers 130,

130*a*, 130*b*, and the insulating inner layers 135, 135*a*. However, the PCB 400 may comprise more or fewer layers of materials or structures, for example materials or structures not illustrated in FIG. 4. In some embodiments, the strain resistant layers 450, 450*a* are configured to engage the first and second surface conductive layers 120, 120*a*, respectively, with other layers of the PCB 400, such as, for example, the insulating layers 125, 125*a*, respectively. The PCB 400 may comprise additional layers not shown in FIG. 4 such as cover coats to protect the PCB 400 against corrosion and contamination, other materials that for example bond various layers of the PCB 400, and the like. In certain embodiments, a solder resist layer can be over the top surface of one or both of the outermost surface conductive layers 120, 120*a*. In some embodiments, the PCB 400 can comprise a through-hole penetrating one or more of the layers of the PCB 400. In certain embodiments, the PCB 400 comprises one or more via holes plated with conductive material. Other various configurations are also possible. In some embodiments, the PCB 400 is a single sided and single layer PCB. In some embodiments, the PCB 400 is a double sided and single layer PCB In an embodiment, the PCB 400 comprises at least one rigid insulating layer extending throughout the entire length of the PCB 400 such that the PCB 400 comprises entirely rigid portions.

Still with reference to FIG. 4, the surface conductive layers 120, 120*a* can be manufactured using one or more suitable processes. In certain embodiments, the surface conductive layers 120, 120*a* comprise electrodeposited copper made by, for example, plating copper from a copper anode to a cathode. In some embodiments, the PCB 400 comprises surface conductive layers 120, 120*a* comprising rolled-annealed copper foil. Rolled-annealed copper foil may be made, for example, by heating copper ingots and rolling and annealing the ingots by passing the ingots through a serious of rollers. Certain non-rigid PCBs can comprise surface conductive layers made of rolled-annealed copper because rolled-annealed copper comprises qualities such as ductility (ability to stretch without breaking given as a ratio of length of stretched portion and original length) make rolled-annealed copper suitable for non-rigid purposes such as, for example, flexibility. In some embodiments, ductility of rolled-annealed copper is about 20-45%, including 25%, 30%, 35%, and 40%. Rolled-annealed copper has not been used with rigid PCBs for several reasons, including higher production costs (e.g., compared with electrodeposited copper), lack of availability of various thicknesses and widths, and the perceived lack of benefit of the flexibility of rolled-annealed copper when used in connection with rigid PCBs comprising non-bending portions. The Applicant has recognized that certain qualities exhibited by rolled-annealed copper, such as ductility, hardness, resistance, etc. can make rolled-annealed copper suitable for rigid PCBs (e.g., may minimize defects from forming in the rigid PCB during lead-free manufacturing). For example, the PCB 400 comprising the surface conductive layer 120 comprising rolled-annealed copper can absorb some thermal stress as elastic deformation, thereby likely reducing defects such as pad cratering from occurring, for example, in portions of the cap layer underneath the surface conductive layer 120. In other embodiments, the ability of the PCB 400 to absorb thermal stress may be increased by using the surface conductive layers 120, 120*a* comprising rolled-annealed copper in combination with the strain resistant layers 450, 450*a* comprising thermal characteristics (e.g., ductility) as further described herein. The surface conductive layers 120, 120*a* can be manufactured using one or more the above processes, other processes, and combinations thereof.

With continued reference to FIG. 4, the surface conductive layers 120, 120*a* and the strain resistant layers 450, 450*a* can be manufactured using one or more suitable processes or methods. In some embodiments, a method of manufacturing the PCB 400 comprises attaching the surface conductive layer 120 to the strain resistant layer 450 using an intermediate layer such as, for example, a bonding intermediate layer (e.g., adhesive).

In some embodiments, a method of manufacturing the PCB 400 comprises adhesivelessly attaching the surface conductive layers 120, 120*a* to the strain resistant layers 450, 450*a*, respectively. The surface conductive layers 120, 120*a* can be adhesivelessly attached to the strain resistant layers 450, 450*a*, respectively, using one or more suitable methods. The surface conductive layers 120, 120*a* and the strain resistant layers 450, 450*a* can be adhesivelessly attached using a "cast to foil" process wherein a solution of strain resistant material, such as, for example, polyimide, is applied to the conductive layers 120, 120*a* and heated, resulting the strain resistant layer 450, 450*a* over the surface conductive layers 120, 120*a*, respectively. In one embodiment, the PCB 400 comprises polyimide (e.g., the strain resistant layer 450) cast-on-copper (e.g., the surface conductive layer 120). The surface conductive layers 120, 120*a* and the strain resistant layers 450, 450*a* can also be adhesivelessly attached using a "sputtering" process wherein conductive cathode (e.g., copper) is bombarded with ions to cause conductive particles impinge on each of the strain resistant layers 450, 450*a* such that the surface conductive layers 120, 120*a* are over the strain resistant layers 450, 450*a*, respectively. In certain embodiments, a method of manufacturing the PCB 400 comprises plating (e.g., electroless plating) conductive material on each of the strain resistant layers 450, 450*a* to form the surface conductive layers 120, 120*a* adhesivelessly engaging the strain resistant layers 450, 450*a*, respectively. In some embodiments, a "vapor deposition" method of making the PCB 400 comprises vaporizing conductive material such as copper in a vacuum chamber and depositing the metal vapor on strain resistant material, thereby forming the strain resistant layers 450, 450*a* adhesivelessly engaging the surface conductive layers 120, 120*a*, respectively. Further still, a method of making the PCB 400 can comprise further treating the surface conductive layers 120, 120*a* engaging the strain resistant layers 450, 450*a*, either adhesivelessly or using an intermediate bonding layer such as an adhesive, with other processes such as, for example, bonding, stabilizing, etc.

Although FIG. 4 illustrates the strain resistant layers 450, 450*a* positioned as cap layers and engaging the surface conductive layers 120, 120*a*, respectively, the strain resistant layers 450, 450*a* can be suitably used with the PCB 400 in other configurations. For example, although FIG. 4 shows the strain resistant layer 450 between the surface conductive layer 120 and the insulating layer 125, the strain resistant layer 450 can be the only dielectric between the surface conductive layer 120 and the first electrically conductive inner layer 130. In some embodiments, additional strain resist materials comprising, for example, polyester, liquid crystal polymer, polyimide, etc. can also be suitably used as binding material in the central, normally rigid, glass layer/prepreg portions of PCBs. In still some embodiments, one or more of the strain resistant layers may be formed (e.g., deposited) elsewhere in the PCB 400. In one embodiment, strain resistant layers can be between and/or engage inner conductive layers, for example, the conductive inner layer 130*a*, and inner insulating layers, such as, for example, the insulating inner layer 135*a*. In some embodiments, the strain resistant layers 450, 450*a* are configured to respectively engage the first and second surface conductive layers 120, 120*a* with other layers of the PCB 400, such as, for example, the conductive inner layers 130, 130*a*.

With continued reference to FIG. 4, the strain resistant layers 450, 450*a* in certain embodiments comprise at least substantially fiberglass-free material. The strain resistant layers 450, 450*a* comprising fiberglass-free material can help to reduce (e.g., minimize, eliminate) the occurrence of electrical failure arising from cathodic/anodic filament (CAF) growth. CAF growth can result in an electrical shorting failure when dendritic metal filaments grow along insulating interfaces (typically layers comprising glass fiber/epoxy resin interface), such as, for example, the insulating inner layers 135, 135*a* and/or the insulating layers 125, 125*a*, creating an electrical path between two or more layers of the PCB 400 that should remain electrically isolated (for example, portions of the surface conductive layer 120 and portions of the conductive inner layer 130 or portions of the conductive inner layer 130 and portions of the conductive inner layer 130*a*). Strain resistant layers in accordance with embodiments disclosed herein can reduce (e.g., minimize, eliminate) CAF growth because, as previously mentioned, the strain resistant layers (for example, the strain resistant layers 450, 450*a*) do not comprise or are substantially free of fiberglass material that might otherwise provide the surface along which the dendritic metal filaments may grow. In certain embodiments, one or more strain resistant layers can be used instead of one or more rigid insulating layers of PCBs, including rigid PCBs (e.g., instead of one or more of the insulating inner layers 135, 135*a* and/or the insulating layers 125, 125*a*).

In accordance to certain embodiments, each of the strain resistant layers 450, 450*a* can have a thickness in the range of about 10-30 microns, including about 10-15 microns, 12-15 microns, 15-17 microns, 15-20 microns, 15-25 microns, and 20-30 microns. In certain embodiments, each of the strain resistant layers 450, 450*a* can have a thickness of about 12 microns, including about 15 microns, 17 microns, 18 microns, 20 microns, 22 microns, 25 microns, and 28 microns. The strain resistant layers 450, 450*a* can comprise thicknesses in the range of about 5-100 microns, including about 10-20 microns, 20-30 microns, 30-40 microns, 40-50 microns, 50-60 microns, 60-70 microns, 70-80 microns, 80-90 microns, 90-100 microns, 100-120 microns, 110-130 microns, and the like. In certain embodiments, each of the strain resistant layers 450, 450*a* can have a thickness of about 35 microns, including about 45 microns, 55 microns, 65 microns, 75 microns, 85 microns, 95 microns, 105 microns, and the like. In one embodiment, each of the strain resistant layers 450, 450*a* have thicknesses of less than 10 microns (e.g., 8 microns), thicknesses of greater than 30 microns (e.g., about 32 microns), or both. In one embodiment, each of the strain resistant layers 450, 450*a* have thicknesses of less than 5 microns (e.g., 1 micron), thicknesses of greater than 130 microns (e.g., about 150 microns), or both. In accordance to certain embodiments, each of the surface conductive layers 120, 120*a* can have a thickness in the range of about 15-25 microns, including about 15-17 microns, 16-18 microns, 17-19 microns, 16-19 microns, and 18-20 microns. The surface conductive layers 120, 120*a* can comprise thicknesses in the range of about 5-100 microns, including about 10-20 microns, 20-30 microns, 30-40 microns, 40-50 microns, 50-60 microns, 60-70 microns, 70-80 microns, 80-90 microns, 90-100 microns, 100-120 microns, 110-130 microns, and the like. In certain embodiments, each of the surface conductive layers 120, 120*a* can have a thickness of about 35 microns, including about 45 microns, 55 microns, 65 microns, 75 microns, 85 microns, 95 microns, 105 microns, and the like. In accordance to various embodiments, each of the surface conductive layers 120, 120*a* can have a thickness of about 16 microns, including 17 microns, 18 microns, 19 microns, 20 microns, 25 microns, 26 microns, etc. In an embodiment, each of the surface conductive layers 120, 120*a* can have thicknesses of less than about 15 microns (e.g., about 14 microns), a thicknesses of greater than about 25 microns (e.g., 27 microns), or both. In one embodiment, each of the surface conductive layers 120, 120*a* can have thicknesses of less than about 5 microns (e.g., about 1 micron), a thicknesses of greater than about 130 microns (e.g., about 150 microns), or both. In an embodiment, the strain resistant layers 450, 450*a* can be about 0.0005 inches thick.

Figure 5:
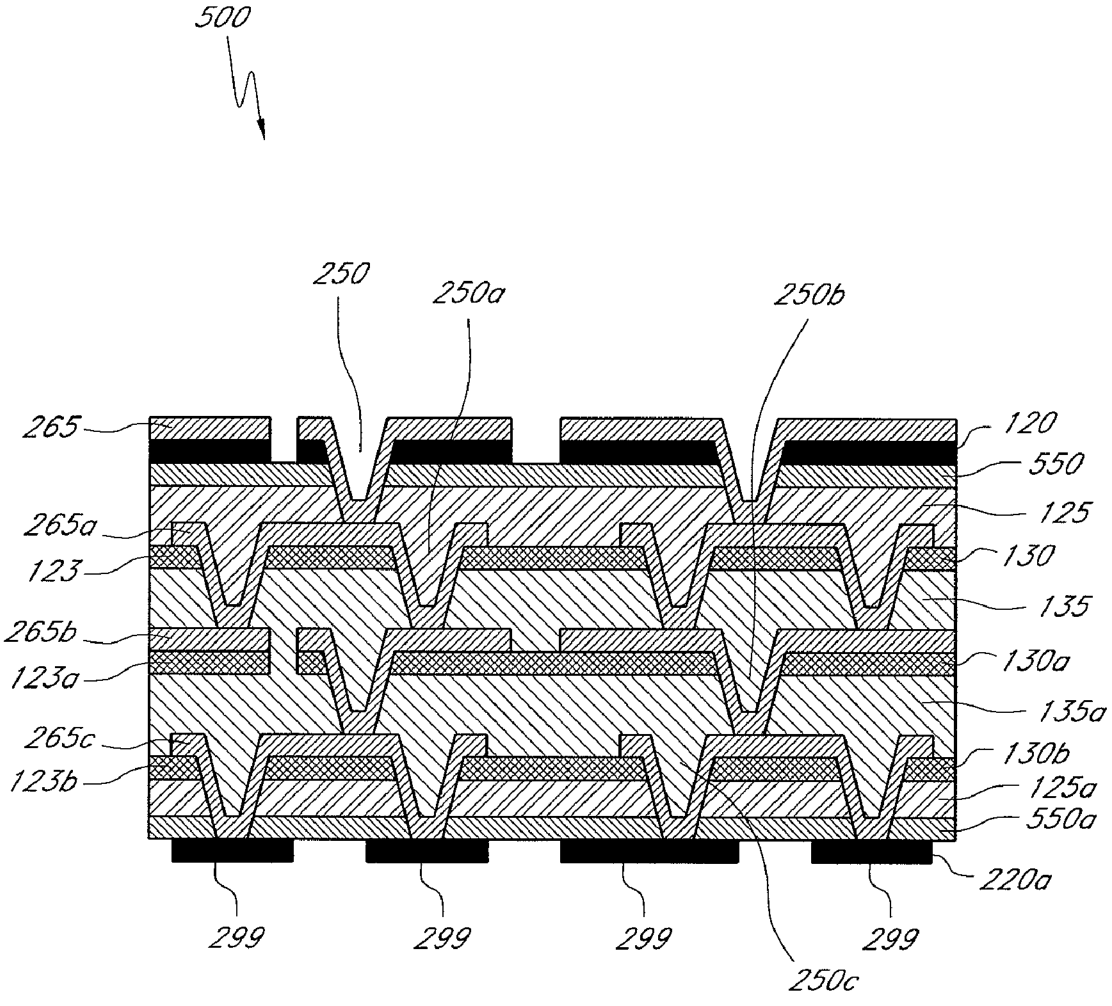
FIG. 5 illustrates an embodiment of a printed circuit board comprising strain resistant layers.

FIG. 5 depicts another embodiment of a multilayer PCB 500 comprising the PCB 200 of FIG. 2 and further comprising first and second strain resistant layers 550, 550*a*. In some embodiments, the first and second strain resistant layers 550, 550*a* each comprise a strain resistant material (e.g., polyimide). The first strain resistant layer 550 is between the first surface conductive layer 120 and the first insulating layer 125. In some embodiments, the top surface of the first strain resistant layer 550 engages the first surface conductive layer 120 and the bottom surface of the first strain resistant layer 550 engages other insulating layers of the PCB 500, such as the first insulating layer 125. The first level via holes 250 are formed on the PCB 500 penetrating the first surface conductive layer 120, the first strain resistant layer 550, and the first insulating layer 125. In some embodiments, the first and second strain resistant layers 550, 550*a* are configured to engage the first and second surface conductive layers 120, 120*a* with other layers of the PCB 500, such as, for example, the conductive inner layers 130, 130*a*.

In some embodiments, the strain resistant material comprises polyimide. In certain embodiments, the surface conductive layer 120 and the first strain resistant layer 550 are pre-formed by electrodepositing conductive material on the first strain resistant layer 550 and the second surface conductive layer 120*a* and the second strain resistant layer 550*a* are pre-formed by electrodepositing conductive material on the second strain resistant layer 550*a*. In some embodiments, the pre-formed layers each comprise commercially available copper and polyimide copper clad laminates such as, for example, Pyralux® AF, available from DuPont.

In some embodiments, the first and second strain resistant layers 550, 550*a* engage the first and second insulating layers 125,125, respectively, using other mechanisms. In certain embodiments, additional strain resistant layers may be positioned elsewhere in the PCB 500. For example, a strain resistant layer (not shown) may be used as a non-cap layer to engage with one or more of the conductive inner layers 130, 130*a*, 130*b*. In some embodiments, strain resistant layers may be employed instead of or in combination with one or more of the insulating inner layers 135, 135*a* and/or the insulating layers 125, 125*a*.

In accordance with various embodiments disclosed herein, a number of processes and methods can be used to manufacture rigid PCBs (or rigid portions of partially rigid PCBs) and assemblies comprising semiconductor and/or circuit components. In some embodiments, a methods of manufacturing a rigid printed circuit board assembly comprises providing a first component comprising a conductive layer and a strain resistant layer, providing a stack of laminates comprising at least one insulating layer, and attaching the first component to the stack of laminates, thereby at least partially (e.g., fully) forming a printed circuit board. In one embodiment, the stack of laminates comprises at last one rigid insulating layer. The conductive layer of the first component can be a surface conductive layer and/or the strain resistant layer of the first component can be a cap layer. In certain embodiments, the method of manufacturing PCBs further comprises mounting or attaching a circuit component on the printed circuit board to thereby form a rigid printed circuit board assembly. In some embodiments, providing the first component comprises providing pre-formed layers of the surface conductive layer 120 and the first strain resistant layer 550 and/or the surface conductive layer 120*a* and the second strain resistant layer 550*a*. In some embodiments, providing the first component comprises adhesivelessly attaching the conductive layer to the strain resistant layer. In certain embodiments, the conductive layer of the first component comprises rolled-annealed copper and/or the strain resistant layer of the first component comprises polyimide.

In some configurations, providing a stack of laminates comprises providing at least one insulating layer comprising a rigid material. In certain embodiments, providing a stack of laminates comprises forming one or more internal conductive layers engaging the one or more insulating layers. In some embodiments, providing the stack of laminates further comprises etching the one or more internal conductive layers, thereby forming circuit patterns (e.g., the circuit patterns 123, 123*a*, 123*b*). With respect to FIG. 5, the first and second insulating layers 125, 125*a*, the first, second, and third conductive inner layers 130, 130*a*, 130*b*, and first and second insulating inner layers 135, 135*a* can form the stack of laminates. In some arrangements, attaching the first component to the stack of laminates comprises connecting the strain resistant layer of the first component with the stack of laminates. In an embodiment, a strain resistant layer (e.g., the strain resistant layer 550) comprises a first surface and a second surface, wherein the first surface is substantially opposite from the second surface (e.g., the top surface of the strain resistant layer 550 engaging the bottom surface of the surface copper layer 120 is substantially opposite from the bottom surface of the strain resistant layer 550 engaging the top surface of the inner insulating layer 125). In some arrangements, attaching the first component to the stack of laminates comprises attaching the bottom surface of the strain resistant layer to the top surface of the stack (e.g., top surface of a first insulating layer of the stack such as the inner insulating layer 125 of FIG. 5). In some configurations, mounting the circuit component onto the rigid printed circuit board to form a rigid printed circuit board assembly comprises connecting the circuit component to the conductive layer of the first component using soldering material.

Figure 6:
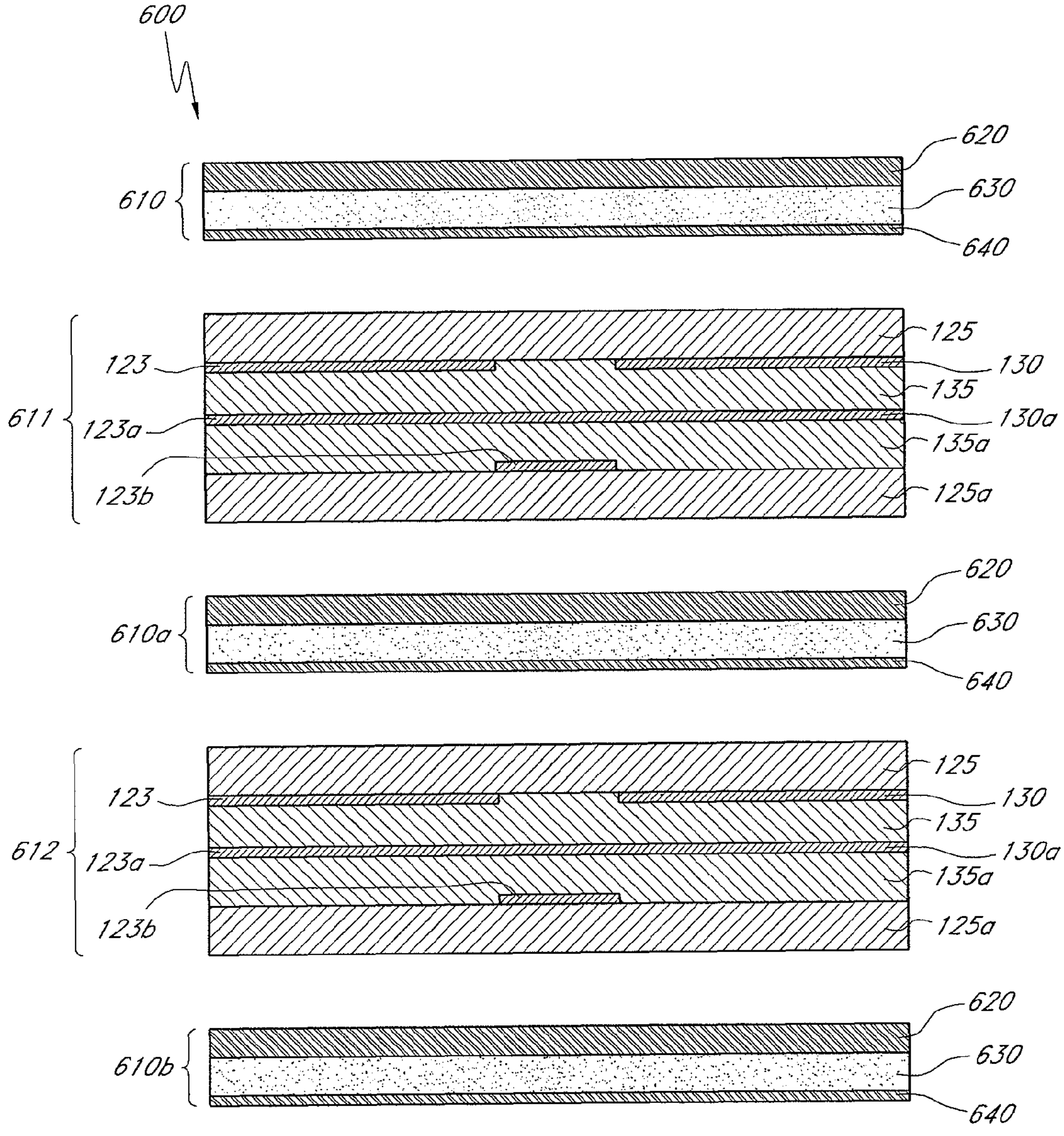
FIG. 6 illustrates an embodiment of a method of manufacturing multilayer printed circuit board stacks using components comprising discardable material.

FIG. 6 illustrates an embodiment of methods and components for manufacturing PCBs, including rigid and partially rigid PCBs, some portions of which may be disclosed in U.S. Pat. No. 5,674,596, the entire content of which is expressly incorporated herein by reference. A stack 600 of laminates for use with rigid PCBs comprises three components 610, 610*a*, 610*b*, each comprising a discardable separator layer 630, and two PCB laminated layers 611, 612. For illustrative purposes only, the PCB laminated layers 611, 612 are illustrated similarly to the PCB 100 of FIG. 1 (e.g., each comprising insulating outer layers 125, 125*a*, inner conductive layers 130, 130*a*, and inner insulating layers 135, 135*a*) but without the surface conductive layers 120, 120*a* of FIG. 1. The components 610, 610*a*, 610*b* each can comprise a discardable layer 630 comprising discardable materials such as metals (e.g., aluminum) between two conductive layers 620, 640. The conductive layers 620, 640 can comprise material different from the discardable layer 630 (e.g., comprising copper when the discardable layer 630 comprises aluminum). The surfaces of the conductive layers 620, 640 facing the discardable layer 630 can be processed to be substantially free of particles or defects, and are protected from exposure to various contaminants, such as, for example, airborne particles and resin dust, by the discardable layer 630. Although the stack 600 shows the three components 610, 610*a*, 610*b* and the two PCB laminated layers 611, 612, the configuration is for illustrative purposes only and the stack 600 can comprise more or fewer numbers of components and/or PCB laminate layers.

In an embodiment of manufacturing one or more PCBs, including rigid PCBs, a method comprises releasing the conductive layers 620, 640 from the discardable layer 630 and to form the outer conductive layers of PCBs as described herein. For example, the method can comprise attaching the conductive layers 620, 640 of the component 610*a* as surface conductive layers to the insulating outer layer 125*a* of the PCB laminate layer 611 and the insulating outer layer 125 of the PCB laminate layer 612, respectively. An embodiment of the method can comprise at least partially separating one or both of the conductive layers 620, 640 of the component 610*a* from the discardable layer 630 of the component 610*a*. The conductive layer 640 of the component 610 can attach as a surface conductive layer to the insulating outer layer 125 of the PCB laminate layer 611. The conductive layer 640 of the component 610 can then at least partially separate from the discardable layer 630 of the component 610. In certain such embodiments, the method can also comprise attaching the conductive layer 620 of the component 610 as a surface conductive layer to the insulating outer layer of another PCB laminate layer (not shown above the component 610), and the conductive layer 620 of the component 610 can then at least partially separate from the discardable layer 630 of the component 610. The conductive layer 620 of the component 610*b* can attach as a surface conductive layer to the insulating layer 125*a* of the PCB laminate layer 612. The conductive layer 620 can then at least partially separate from the discardable layer 630 of the component 610*b*. In certain such embodiments, the method can comprise attaching the conductive layer 640 as a surface conductive layer to the insulating outer layer of another PCB laminate layer (not shown below the component 610*b*), and then at least partially separating the conductive layer 640 of the component 610*b* from the discardable layer 630 of the component 610*b*. After separation from the conductive layers 620, 640 of the components 610, 610*a*, 610*b*, the method can comprise discarding the discardable layers 630 of the components 610, 610*a*, 610*b* (e.g., by selective etching of the material of the discardable layers 630). In certain embodiments, the conductive layers of the components comprising discardable layer (e.g., the conductive layer 620 of the component 610*a* comprising the discardable layer 630) are first released from the components by, for example, at least partially separating the conductive layers from the discardable layer, and then attached to the conductive layers as surface conductive layers of PCB laminates (e.g., to the insulating layer 125*a* of PCB laminate 611).

Figure 7A:
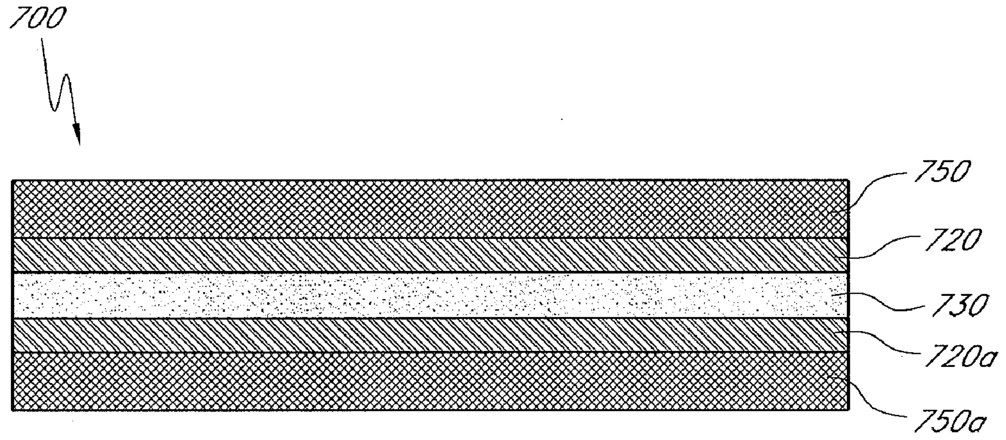
FIG. 7A illustrates an embodiment of a component for manufacturing printed circuit boards comprising a discardable layer and strain resistant layers.

FIG. 7A shows a component 700 for manufacturing PCBs comprising two conductive layers 720, 720*a* and a discardable layer 730 comprising discardable materials, including metals, such as, for example, aluminum. The two conductive layers 720, 720*a* (e.g., each comprising copper) are over opposite sides of the discardable layer 730. The component 700 further comprises stress resistant layers 750, 750*a* over the outer surfaces of the conductive layers 720, 720*a*. Returning back to FIG. 6, the component 700 of FIG. 7 can be used instead of one or more of the components 610, 610*a*, 610*b*, thereby attaching the strain resistant layers 750, 750*a*, as well as the conductive layers 720, 720*a*, onto one or more of the PCB laminate layers 611, 612 and/or other PCB laminate layers (not shown). For example, when using the component 700 in place of the component 610*a*, the method of manufacturing PCBs can comprise attaching the strain resistant layers 750, 750*a* to the insulating outer layer 125*a* of the PCB laminate layer 611 and the insulating outer layer 125 of the PCB laminate layer 612, respectively. The conductive layers 720, 720*a* of the component 700, which still are attached to the strain resistant layers 750, 750*a*, respectively, also attach to the PCB laminate layers 611, 612, respectively, as surface conductive layers. In certain embodiments, the method can comprise at least partially separating one or both of the conductive layers 720, 720*a* of the component 700 from the discardable layer 730 of the component 700. In an embodiment, the discardable layer 730 of the component 700 can be discarded (e.g., by selective etching of the material of the discardable layer 730). In a further embodiment, the discardable layer 730 is discarded after one or both of the conductive layers 720, 720*a* at least partially separate from the discardable layer 730. In this manner, the conductive layers 720, 720*a* and the strain resistant layers 750, 750*a* can be effectively attached to PCB laminates 611, 622, respectively. In some embodiments, the component 700 comprises preformed layers of the first conductive layer 720 engaging the strain resistant outer layers 750, the second conductive layer 720*a* engaging the second stress resistant outer layers 750*a*, or both. In other embodiments, the pre-formed layers comprise laminated products, such as, for example, DuPont's Pyralux® FR, Pyralux® LF, etc.

Figure 7B:
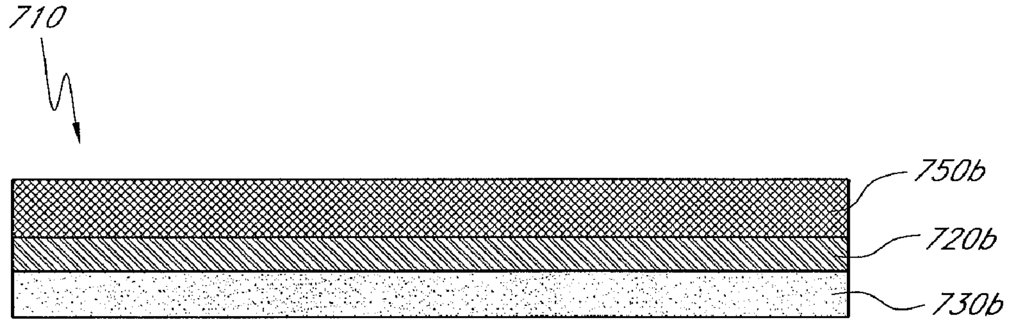
FIG. 7B illustrates another embodiment of a component for manufacturing printed circuit boards comprising a discardable layer and a strain resistant layer.

FIG. 7B shows an embodiment of another component 710 for use with manufacturing PCBs, including rigid PCBs. The component 710 comprises a discardable separator 730*b*, a conductive layer 720*b*, and a strain resistant layer 750*b*. The conductive layer 720*b* is over the discardable layer 730*b* and engages the discardable layer 730*b*. The strain resistant layer 750*b* is over the conductive layer 720*b* and engages the conductive layer 720*b*. Returning back to FIG. 6, the component 710 can be used to provide the strain resistant layer 750*b* and the conductive layer 720*b* over the outermost PCB laminates 611, 612 of the stack 600. For example, if the PCB laminate layer 612 is the outermost PCB laminate layer on the bottom of the stack 600, using double-sided components such as the component 700 could cause at least one of the conductive layers 720, 720*a* of the component 700 and at least one of the strain resistant layers 750, 750*a* of the component 700 to be discarded without attaching to anything. The component 710 of FIG. 7B can advantageously be used on outer PCB laminates of the stack 600 instead of the component 700, thereby eliminating the unnecessary discarding of conductive layers and/or strain resistant layers. The strain resistant layer 750*b*, as well as the conductive layer 720*b*, of the component 610*b* can attach to the insulating layer 125*a* of the outer most PCB laminate layer, (e.g., the PCB layer 612). The conductive layer 720*b* can then at least partially separate from the discardable layer 730*b* of the component 710. The discardable layer 730*b* of the component 710, for example after at least partial separation from the conductive layer 720*b* of the component 710, can be discarded (e.g., by selective etching of the material of the discardable layer 730).

In certain preferred embodiments of the components disclosed in FIGS. 6, 7A, and 7B, the conductive layers 620, 640, 750*a*, 750*b* comprise copper and/or the discardable layers 630, 730 comprise aluminum. However, the conductive layers 620, 640, 750*a*, 750*b* and/or the discardable layers 630, 730 can comprise any suitable metals, including, without limitation, gold, nickel, copper, aluminum, nickel, kovar, steel, and alloys and combinations thereof, without departing from the embodiments disclosed in the present application.

C. Strain Resistant Materials and Material Characteristics

Material characteristics and other properties of the strain resistant layers disclosed in various embodiments herein will now be discussed. The strain resistant layers comprise, among others, mechanical and thermal characteristics that may resist, for example, damage caused by stress, including, without limitation, thermal and mechanical strain. In certain embodiments, the strain resistant layers may comprise more stable material (e.g., thermally, physically, mechanically, etc.) than rigid insulating layers as described herein. In some embodiments, the strain resistant layers can be more dimensionally stable, for example, under high temperatures, than rigid insulating layers. In some embodiments, the strain resistant layers comprise a material suitable for manufacturing PCBs comprising non-rigid bendable portions, such as, for example, polyester, polyimide, aromatic polyimide, combinations thereof, and the like. In some embodiments, the strain resistant layers can be manufactured from a mixture of the above-mentioned or other materials. In some embodiments, the strain resistant layers comprise resin such as polyimide having one or more of the following characteristics: fully cured, substantially halogen free, non-glass reinforced, substantially lead free, and substantially fiberglass free. In some embodiments, the strain resistant layers comprise resin such as polyimide comprising at least two of the following characteristics: fully cured, substantially halogen free, non-glass reinforced, substantially lead free, and substantially fiberglass free. In some embodiments, the strain resistant layers comprise plastics such as polyimide including a halogen and/or fiberglass. In certain embodiments, the strain resistant layers are substantially free of at least one of the following materials: halogen, fiberglass, and lead. The resistant layers can be substantially free of lead. In one embodiment, the strain resistant layers are substantially free of halogen. In a certain embodiment, the strain resistant layers are substantially free of fiberglass. In some embodiments, the strain resistant layers comprise partially, substantially, or fully cured or uncured polyimide. The strain resistant layers can also comprise material that is at least partially reinforced with some fiberglass.

The strain resistant layers in accordance with embodiments disclosed herein may provide one or more advantages, including when used in connection with rigid PCBs. Strain resistant layers and materials as described herein have not been used with rigid PCBs for several reasons, including higher production costs, lack of availability of various thicknesses and widths, the perceived lack of benefit of characteristics of these materials when used in connection with rigid PCBs comprising non-bending portions, and the like. The Applicant has recognized that certain qualities exhibited by strain resistant materials (e.g., one or more of ductility, hardness, resistance, and the like) can make the strain resistant layers suitable for rigid PCBs as further described herein. For example, strain resistant layers comprising low loss material such as polyimide can dissipate less power along longer lengths than non-low loss materials and can allow for higher density circuits. In another example, strain resistant layers in accordance with various embodiments herein can have higher electrical resistance. Strain resistant layers comprising material having higher electrical resistance can perform better under high temperatures by retaining insulating properties under high temperatures that may degrade insulating qualities of other types of insulating layers (for example, epoxies). The strain resistant layers comprising material having higher electrical resistance, therefore, can help reduce (e.g., minimize, eliminate) electrical failures caused by, among others, insulating layers rendered defective by high temperatures.

FIG. 8 illustrates various characteristics of example insulating layers. In accordance with various embodiments disclosed herein, strain resistant layers comprising resins such as, without limitation, polyimide or polyimide-based materials can be configured to reduce (e.g., minimize, eliminate), among other defects, pad cratering. FIG. 8 illustrates typical properties for an example strain resistant layer comprising polyimide as well as typical values for FR-4 and High-Temp FR-4 rigid insulating layers. The values in FIG. 8 were obtained using methods in accordance with IPC TM-650 (Association Connecting Electronics Industries Test Method Manual by HIS) and/or ASTM International Standards Worldwide (e.g., ASTM D-190, ASTM D-696, etc.).

As illustrated in FIG. 8, the strain resistant layers, for example comprising polyimide, can be advantageously more ductile than non-strain resistant layers. The ductility (sometimes also referred to as elongation) of an embodiment of a strain resistant layer, for example comprising polyimide, can be in the range of about 15-80%, and also can be about 20%, 25%, 30%, 40%, 45%, 50%, 60%, 65%, 70%, and 75%. In certain embodiments, the strain resistant layer comprises ductility in the range of about 15-20%, 20-30%, 30-40%, 20-60%, 40-80%, 50-80%, 15-35%, and the like. Further still, the strain resistant layers can comprise ductility different from the ranges provided herein, and can comprise ductility less than about 15% (e.g., about 10%), greater than about 80% (e.g., about 90%). In some embodiments, the strain resistant layers comprise ductility of at least about 15%.

The strain resistant layers can comprise higher ductility properties than other insulating materials (for example, ductility of less than 5% for both FR-4 and High-Temp FR-4 epoxies). As previously mentioned, thermal stress resulting from changes in temperature can cause unequal responses (e.g., rates of expansion, contraction, etc.) in insulating and non-insulating layers, including cap layers, of PCBs and other materials (e.g., surface conductive layers, soldering materials, electrical component conductive pads, etc.). In some situations, thermal stress can cause the surface conductive layers of PCBs and cap layers underneath the surface conductive layers to move relative to each other (e.g., in opposite directions, in other directions placing strain on the connection between the cap layers and the surface copper layers, etc.) such that defects such as pad cratering form in or around, among others, the cap layers. The strain resistant layers in accordance with embodiments disclosed herein are more ductile than other insulating layers (e.g., FR-4), and can reduce (e.g., minimize, eliminate) pad cratering by, among others, at least absorbing some of the thermal stress as elastic deformation. Embodiments of strain resistant layers comprising ductile material as disclosed herein can also absorb mechanical stress exerted onto components of PCBs (e.g., cap layers), for example, by other more rigid PCB components such as lead-free soldering material, further reducing the occurring of defects such as pad cratering in the PCB components including in the cap layers.

Although FIG. 8 illustrates characteristics of certain strain resistant layers, including strain resistant layers comprising polyimide (a polyimide cap layer), these values are representative of only the one example of a strain resistant layer and are not a comprehensive representation of all possible strain resistant layers. The various disclosed PCB embodiments can suitably comprise strain resistant layers having different mixtures of polyimide, strain resistant layers comprising other strain resistant materials such as, for example, liquid crystal polymer, train resistant layers comprising mixtures of polyimide and other strain resistant materials, or a combination thereof. In some embodiments, strain resistant layers comprising a different mix of polyimide and/or other materials may have elongation and other properties that are different from FIG. 8 (for example, a strain resistant layer may have a Tg outside the range of about 220-420° C., ductility outside the range of about 15-80%, etc.).

In accordance with certain embodiments disclosed herein, strain resistant layers (e.g., comprising polyimide) can have favorable properties that may reduce (e.g., minimize, eliminate) failures caused by, among others, pad cratering. In particular and as can be seen in FIG. 8, strain resistant layers comprising polyimide can have a Glass Transition Temperature (Tg) range of about 220-420° C., and can also have Tg values of about 240° C., 290° C., 340° C., 390° C., 440° C., and 490° C. In some embodiments, the strain resistant layer comprises Tg values of about 210° C., including Tg values of about 215° C., 230° C., 235° C., 245° C., 250° C., 255° C., 265° C., 270° C., 285° C., 300° C., 305° C., 315° C., 330° C., 350° C., 360° C., 370° C., 375° C., 385° C., 400° C., 405° C., 415° C., 430° C., 445° C., 455° C., 460° C., 470° C., and the like. In certain embodiments, the strain resistant layer comprising material such as polyimide comprise Tg values in the range of about 220-450° C., including about 250-300° C., 300-350° C., 350-400° C., 400-450° C., 450-500° C. and the like. In certain embodiments, the strain resistant layer can comprise Tg values in the range of about 220-230° C., including about 230-240° C., 235-245° C., 245-260° C., 260-280° C., 280-290° C., 290-310° C., 310-320° C., 320-340° C., 340-360° C., 360-370° C., 375-395° C., 400-420° C., 405-415° C., 410-430° C., 430-460° C., 250-350° C., 350-450° C., and the like. Further still, the strain resistant layers can comprise Tg values different from the ranges provided herein, and can comprise Tg less than 220° C. (e.g., 200° C.), greater than 420° C. (e.g., 500° C.), or both. In some embodiments, the strain resistant layers comprise material such as polyimide having Tg of at least 220° C. The strain resistant materials can comprise higher Tg values than other rigid insulating layers (e.g., roughly 170° C. and 180° C. for FR-4 and High-Temp FR-4, respectively.

As illustrated in FIG. 8, the total expansion due to temperature up to solder reflow temperature is lower for a material having higher Tg range (e.g., polyimide) than for a material having a lower Tg (e.g., FR-4). Materials with higher Tg ranges can be advantageous for use as insulating layers, including for use as cap layers in rigid PCBs, because such materials can maintain their dimensional stability (e.g., expand and/or contract less in response to, among others, changes in temperature) over a wider temperature range, potentially reducing the likelihood that cracks will occur in various PCB layers, including cap layers.

As shown in FIG. 8, certain strain resisting layers comprising polyimide comprise Coefficients of Thermal Expansion (CTE), including CTE values in the lateral (X and Y) directions (CTE X,Y) configured to, among others, resist defects such as pad cratering that occur in insulating layers, including cap layers. CTE X,Y values for certain such strain resistant layers can be lower than the CTE X,Y values for other insulating layers, including rigid insulating layers. Materials having lower CTE X,Y characteristics (e.g., polyimide) are more stable than materials having higher CTE X,Y characteristics (e.g., FR-4, High-Temp FR-4) because materials having lower CTE X,Y values generally are less responsive (e.g., expand, contract, etc.) to temperature changes. For example, FIG. 8 illustrates that CTE X,Y for polyimide above the Tg is in the range of about 20 parts per million per ° C. in temperature (ppm/° C.) and about 42 ppm/° C., including CTE X,Y of about 20 ppm/° C., 25 ppm/° C., 30 ppm/° C., 35 ppm/° C., 38 ppm/° C., 39 ppm/° C., 40 ppm/° C., 41 ppm/° C., and 42 ppm/° C. By comparison, FR-4 has a higher CTE X,Y of 140 ppm/° C. and High-Temp FR-4 had a higher CTE X,Y of 45 ppm/° C. Thus, the strain resistant layers comprising polyimide expands less than other insulating layers such as rigid cap layers even under similar temperature conditions, and therefore, the strain resistant layers can reduce thermal forces that apply stress on various components of PCBs, including cap layers.

In certain embodiments, the strain resistant layer comprising material such as polyimide comprise CTE X,Y values in the range of about 15-45 ppm/° C., including about 20-25 ppm/° C., 20-30 ppm/° C., 25-30 ppm/° C., 20-25 ppm/° C., 25-35 ppm/° C., and the like. Further still, the strain resistant layers can comprise CTE X,Y values different from the ranges provided herein, and can comprise CTE X,Y less than about 20 ppm/° C. (e.g., about 15 ppm/° C.), greater than about 42 ppm/° C. (e.g., about 50 ppm/° C.), or both. In some embodiments, the strain resistant layers comprise material having CTE X,Y of about 45 ppm/° C. or less. The strain resistant materials can also comprise CTE of about 25 ppm/° C. or less, including about 23 ppm/° C., 21 ppm/° C., 19 ppm/° C., 18 ppm/° C., 10 ppm/° C., and the like.

In certain embodiments, the example strain resistant layers comprise CTE, XY characteristics that better match CTE, XY characteristics of other components such as surface copper layers. For example, typical CTE X,Y values for copper and tin-lead solder are around 16 ppm/° C. and 27 ppm/° C., respectively. The CTE X,Y range of about 20 to 42 ppm/° C. (e.g., 25 ppm/° C.) of the example strain resistant layers are closer to the CTE X,Y values of copper and tin-lead than the CTE X,Y values of rigid insulating layers such as FR-4, and therefore, the strain resistant layers and the other components (e.g., surface copper layer) exhibit similar thermal responses under similar thermal conditions (e.g., expand similarly under high temperature). Two layers of different PCB materials (e.g., a cap layer and a surface copper layer) comprising similar thermal coefficients generally exhibit similar thermal behaviors and thus can reduce thermal forces that move one layer relative to the other layer so as to create a defect such as a crack in one layer (e.g., the cap layer). Strain resistant layers comprising CTE values closer to CTE values of surface copper layers than other rigid insulating layers may be more dimensionally stable than the other rigid insulating layers. Thermally matching the strain resistant layers and other materials such as surface copper layers and solder materials can reduce thermal stress on the strain resistant layers (cap layers as shown in FIG. 4) or other insulating layers of PCBs, and the reduced thermal stress may also reduce (e.g., minimize, eliminate) the occurrence of pad cratering in the cap layers or other layers. Further, the strain resistant layers can comprise other material (e.g., inorganic filler) to reduce the difference of CTE between the strain resistant layers and other layers (e.g., surface conductive layers).

The strain resistant layers in accordance with embodiments discloses herein advantageously comprise tensile strength characteristics suited for reducing (e.g., minimizing, eliminating, etc.) damage occurring in, among others, insulating layers such as cap layers. Tensile strength indicates the level at which stress causes sufficient change in the material (e.g., at least partially break, deform, decompose, etc.) such that the change at least interferes with the normal operation of the material and/or the PCB in which the material is located, for example, by causing electrical or mechanical failure. Therefore, insulating layers comprising strain resistant materials having higher tensile strengths perform better because the strain resistant layers can operate under stress levels that otherwise cause defects in materials having lower tensile strengths.

As illustrated in FIG. 8, the strain resistant materials can comprise polyimide having tensile strength in the range of about 10,000-50,000 psi and can include tensile strengths of about 15,000 psi, 20,000 psi, 25,000 psi, 30,000 psi, 35,000 psi, 40,000 psi, 45,000 psi, 50,000 psi, 53,000 psi, etc. In certain embodiments, the strain resistant layer comprising material such as polyimide comprise tensile strength in the range of about 10,000-20,000 psi, including about 25,000-35,000 psi, 35,000-45,000 psi, 15,000-30,000 psi, 25,000-45,000 psi, and the like. Further still, the strain resistant layers can comprise tensile strength values different from the ranges provided herein, and can comprise tensile strength less than about 10,000 psi (e.g., about 5,000 psi), greater than about 50,000 psi (e.g., about 75,000 psi), or both. In some embodiments, the strain resistant layers comprise material such as polyimide having tensile strength of at least about 10,000 psi.

In accordance with certain embodiments, the strain resistant layers comprise strain resistant material having a unique combination of two or more of the aforementioned characteristics (e.g., tensile strength, ductility, CTE X,Y, etc.). Although strain resistant layers comprising, for example, one of the aforementioned characteristics (e.g., ductility) can help reduce or eliminate various defects, strain resistant layers comprising two or more of theses qualities are even more suited to reduce (e.g., minimize, eliminate, etc.) various types of damage, including pad cratering, that occur in insulating layers such as cap layers. For example, the strain resistant layers 450,450*a* of FIG. 4 comprising two or more of these characteristic (e.g., tensile strength, ductility, CTE X,Y, etc.) are more apt to resist damage such as pad cratering from occurring than other insulating layers comprising, for example, fewer than two of these characteristics.

In accordance with such certain embodiments, the strain resistant layers comprise strain resistant materials having two or more of the following characteristics: ductility in the range of about 15-80%, including about 15-20%, 20-30%, 30-40%, 20-60%, 40-80%, 50-80%, and 15-35%; Tg in range of about 220-420° C., including about 220-250° C., including about 250-300° C., 300-350° C., and 350-400° C.; and tensile strength in the range of about 10,000-50,000 psi, including about 10,000-20,000 psi, 25,000-35,000 psi, 35,000-45,000 psi, 15,000-30,000 psi, 25,000-45,000 psi, and the like.

In accordance with further certain embodiments, the strain resistant layers comprise two or more of the following characteristics: ductility of at least about 15%, including about 20%, 25%, 30%, 40%, 45%, 50%, 60%, 65%, 70%, 75%, and 85%; Tg of at least about 220° C., including about 240° C., 290° C., 340° C., 390° C., 440° C., and 490° C.; and tensile strength of at least about 10,000 psi, including about 15,000 psi, 20,000 psi, 25,000 psi, 30,000 psi, 35,000 psi, 40,000 psi, 45,000 psi, 50,000 psi, and 53,000 psi. In other embodiments, the strain resistant layers comprise two or more of the following characteristics: ductility of at least about 15%; Tg of at least about 220° C.; tensile strength of at least about 10,000 psi; and CTE X,Y of 45 ppm/° C. or less.

FIG. 9 illustrates Z-axis expansion for example strain resistant layers comprising polyimide relative to similarly sized FR-4 and High-Temp FR-4, all of which having 1 inch (25.4 millimeter) by 1 inch X, Y dimensions. PCBs comprising the various types of insulating layers were subjected to high temperatures during soldering electronic components to the PCBs, for example, about 215° C. during the leaded solder reflow process and 245° C. during the lead-free solder reflow process. At temperatures ranging from 20° C. to Tg, the example strain resistant layer, FR-4, and High-Temp FR-4 expanded by about 0.094107 millimeters (mm), about 0.053340 mm, about 0.065024 mm, respectively. At temperatures ranging from Tg to the leaded solder reflow temperature (215° C.), FR-4 expanded by about 0.160020 mm and High-Temp FR-4 expanded by about 0.040005 mm whereas the example resistant layer expanded by an insignificant amount. For temperatures ranging from Tg to lead-free reflow temperature (245° C.), the example strain resistant layer expanded by about 0.025400 mm, whereas both the FR-4 and the High-Temp FR-4 expanded by higher values of about 0.266700 mm and about 0.074232, respectively. Total expansion for the example strain resistant material for leaded solder reflow was about 0.094107 mm, which was less than each of the total leaded solder reflow expansions of FR-4 and High-Temp FR-4 (about 0.119507 mm and about 0.105029 mm, respectively). Total expansion for the example strain resistant material for lead-free solder reflow was about 0.119507 mm, which was less than each of the total lead free solder reflow expansions of FR-4 and High-Temp FR-4 (about 0.320040 mm and about 0.139319 mm, respectively). In one embodiment, the strain resistant layers comprise aromatic polyimide. As such, cap layers and other insulating layers comprising the strain resistant layers (e.g., polyimide) as disclosed herein can advantageously maintain dimensional stability over a wide temperature range.

D. Detailed Descriptions of Further Non-Limiting Embodiments

Figure 10A:
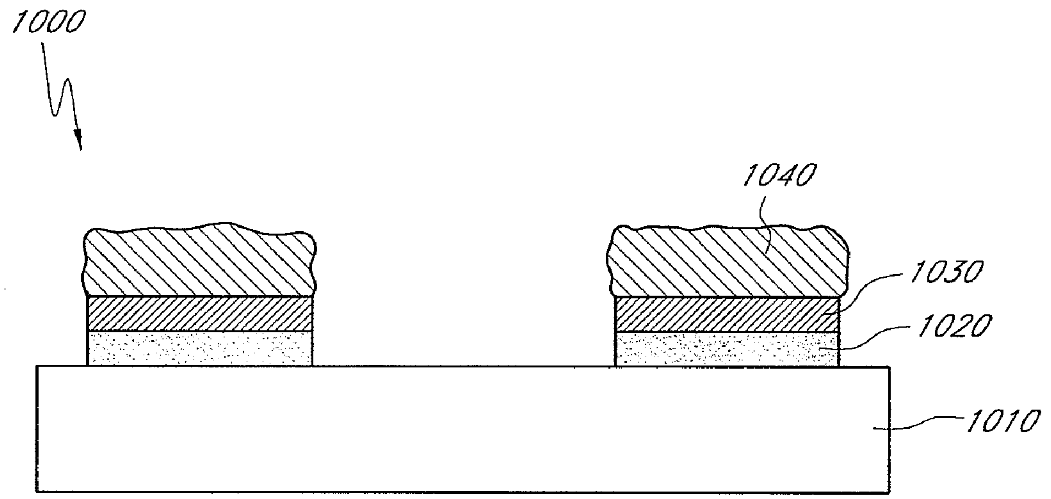
FIG. 10A illustrates an embodiment of a rigid printed circuit board.
Figure 10B:
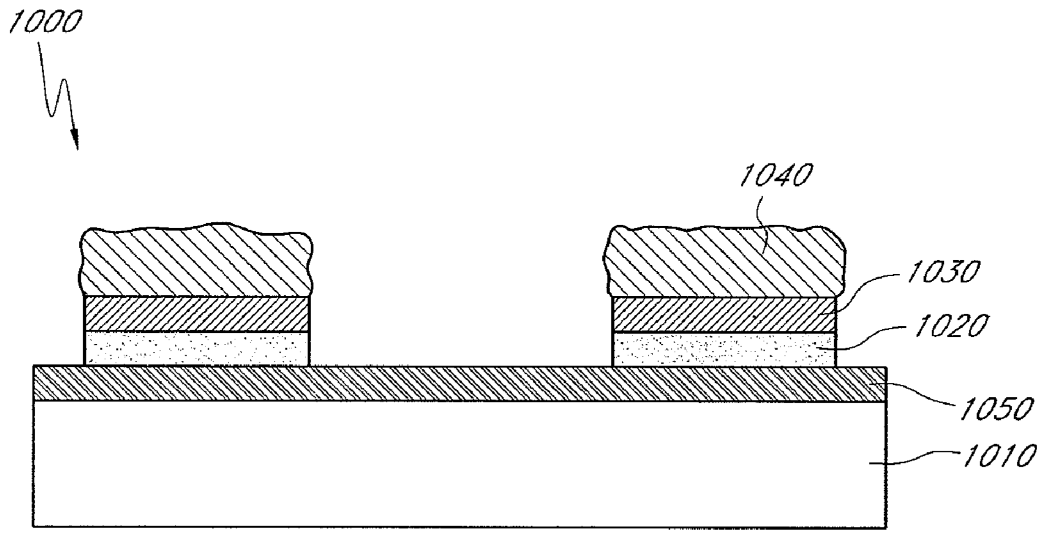
FIG. 10B illustrates an embodiment of a rigid printed circuit board comprising a strain resistant cap layer.

FIGS. 10A and 10B illustrates a schematic diagram of an embodiment of a rigid PCB 1000. In FIG. 10A, the PCB 1000 comprises a rigid dielectric 1010, a conductive surface layer 1020, and a solder material 1040. The PCB 1000 optionally comprises a conductive plate 1030 between the conductive surface layer 1020 and the solder material 1040. The rigid dielectric 1010 comprises a rigid material such as, without limitation, standard FR-4 Epoxy or High-Temp FR-4 Epoxy. The conductive surface layer 1020 comprises a conductive material such as copper and can be formed by etching the conductive material. The rigid dielectric 1010 engages the surface conductive layer 1020. The conductive plate 1030 is over the conductive surface layer 1020. The solder material 1040 is deposited over the conductive plate 1030. The solder material 1040 connects an electrical component (not shown) with the PCB 1000, thereby forming a rigid printed circuit board assembly. As already mentioned, high temperatures, for example, in excess of 400° C. used in lead-free soldering processes, are applied to the soldering material 1040 to connect the electrical component with the PCB 1000. Subjecting the PCB 1000 and the rigid dielectric layer 1010 to high temperatures can cause defects to occur in the rigid dielectric 1010, for example, underneath the conductive surface layer 1020.

FIG. 10B shows the PCB 1000 of FIG. 10A comprising an insulating layer 1050 between the conductive surface layer 1020 and the rigid dielectric 1010. The top surface of the insulating layer 1050 is configured to engage the conductive surface layer 1020 and the bottom surface of the insulating layer 1050 is configured to engage the rigid dielectric 1010. As previously mentioned, the insulating layer 1050 comprises materials having better characteristics (e.g., thermal, mechanical, physical, etc.) than the rigid dielectric layer 1010, such as, for example, higher Tg (greater than or equal to about 220° C.). In some embodiments, the insulating layer 1050 has ductility of greater than or equal to about 15%. In various embodiments, the insulating layer 1050 has tensile strength greater than or equal to about 10,000 psi. In some embodiments, the insulating layer 1050 comprises polyimide. In certain embodiments, the insulating layer 1050 comprises another strain resistant material (e.g., liquid crystal polymer, polyester, etc.). As mentioned above, the insulating layer 1050 comprises materials that can perform better under high temperatures (e.g., expand less, absorb stress, etc.) and therefore a PCB comprising the insulating layer 1050 engaging the surface conductive layer 1010 can reduce (e.g., minimize, eliminate) the occurrence of defects underneath the conductive surface pad 1020 including, for example, pad cratering. In some embodiments, a circuit component (not shown), for example an Integrated Circuit (IC) chip component, can be mounted on the PCB 1000 using the solder material 1040, thereby forming a printed circuit board assembly.

Further non-limiting specific embodiments of strain resistant layers as disclosed herein can be found, for example, at FIGS. 1 and 2 and pages 3-6, of the above-specified U.S. Provisional App. No. 61/016,292, the content of which is hereby entirely incorporated by reference, and FIGS. 1-7 of the above-specified U.S. Provisional App. No. 61/078,315, the entire content of which is hereby entirely incorporated by reference.

The various embodiments described herein can also be combined to provide further embodiments. Related methods, apparatuses, and systems utilizing strain resistant layers, including, without limitation, polyimide layers, in rigid printed circuit boards, are described in the above-referenced provisional applications to which this application claims priority, the entireties of each of which are hereby expressly incorporated by reference: U.S. Provisional Patent Application Ser. No. 61/016,292, which was filed on Dec. 21, 2007, and U.S. Provisional Application No. 61/078,315, which was filed on Jul. 3, 2008. While the above-listed applications may have been incorporated by reference for particular subject matter as described earlier in this application, the Applicant intends the entire disclosures of the above-identified applications to be incorporated by reference into the present application, in that any and all of the disclosures in these incorporated applications may be combined and incorporated with the embodiments described in the present application.

Although the foregoing description has shown, described, and pointed out the fundamental novel features of the embodiments disclosed herein, it will be understood that various omissions, substitutions, and changes in the form of the detail of the apparatus as illustrated, as well as the uses thereof, may be made by those skilled in the art, without departing from the spirit or scope of the disclosed embodiments. Consequently, the scope of the present application should not be limited to the foregoing discussion, but should be defined by the appended claims.

The invention claimed is:

1. A device for mounting electrical components, the device comprising:

- a printed circuit board having a planar dimension many times greater than any one electrical component mounted thereon, the printed circuit board comprising:
  - a surface conductive layer configured to interface with the electrical components via at least one lead-free solder component, wherein the surface conductive layer comprises copper;
  - a strain resistant cap layer configured to engage the surface conductive layer, wherein the strain resistant cap layer comprises polyimide and an inorganic filler for increasing the strength of the cap layer, the tensile strength of the cap layer being about 25,000-35,000 psi, wherein the elongation of the cap layer is about 15-35%; and at least one rigid insulating layers laminated to the strain resistant layer without a bonding layer, wherein the at least one rigid insulating layers extends throughout the entire length of the printed circuit board such that the entire printed circuit board defines a rigid printed circuit board;

wherein the at least one rigid insulating layer has a tensile strength which is at least 1.3 times greater than the strain resistant cap layer.

2. The device of claim 1, wherein the strain resistant cap layer comprises at least two characteristics selected from a group of: ductility of at least about 15%, Tg of at least about 220° C., and tensile strength of at least about 25,000 psi.

3. The device of claim 1, wherein the strain resistant cap layer comprises at least one characteristic selected from the group of: fully cured, substantially halogen free, non-glass reinforced, substantially lead free, and substantially fiberglass free.

4. The device of claim 1, wherein the strain resistant cap layer comprises a CTE X,Y value of about 40 ppm/° C. or less.

5. The device of claim 1, wherein the strain resistant cap layer has thickness in the range of about 10-30 microns.

6. The device of claim 1, wherein the strain resistant cap layer comprises tensile strength in the range of about 26.000-32,000 psi.

7. The device of claim 1, wherein the strain resistant cap layer comprises ductility in the range of about 20-30%.

8. The device of claim 1, wherein the strain resistant cap layer comprises aromatic polyimide.

9. The device of claim 1, wherein the surface conductive layer comprises electrodeposited copper.

10. The device of claim 1, further comprising the strain resistant layer cast-on the surface conductive layer.

11. The device of claim 1, wherein the strain resistant cap layer comprises tensile strength in the range of about 10,000-15,000 psi.

12. A printed circuit board having a planar dimension many times greater than any one electrical component mounted thereon comprising:

a conductive layer configured to interface with electrical components mounted on the printed circuit board;

a strain resistant layer defining a cap layer engaging the conductive layer, wherein the strain resistant layer comprises ductility between about 15% and 50% and tensile strength of at least about 10,000 psi, the strain resistant layer further comprising a filler; and at least one rigid insulating layer laminated to the strain resistant layer, without a bonding layer, the insulating layer extending throughout the entire length of the printed circuit board, wherein the entire printed circuit board comprises substantially rigid portions;

wherein the rigid insulating layer has a tensile strength that is greater than the tensile strength of the strain resistant layer.

13. The printed circuit board of claim 12, wherein the strain resistant layer comprises Tg of at least about 220° C.

14. The printed circuit board of claim 12, wherein the strain resistant layer comprises polyimide.

15. The printed circuit board of claim 12, wherein the conductive layer comprises copper.

16. The printed circuit board of claim 12, wherein the conductive layer comprises rolled-annealed copper.

17. The printed circuit board of claim 12, wherein the conductive layer comprises electrodeposited copper.

18. The printed circuit board of claim 12, wherein the strain resistant cap layer comprises at least one characteristic selected from the group of: fully cured, substantially halogen free, non-glass reinforced, substantially lead free, and substantially fiberglass free.

19. A device for mounting electrical components, the device comprising:

a printed circuit board comprising;

a surface conductive layer configured to interface with the electrical components via at least one lead-free solder component, wherein the surface conductive layer comprises copper;

a strain resistant cap layer configured to engage the surface conductive layer, wherein the strain resistant cap layer comprises polyimide and an inorganic filler, wherein the elongation of the cap layer is about 15-50%; and at least one rigid insulating layer laminated to the strain resistant layer, wherein the at least one rigid insulating layer extends throughout the entire length of the printed circuit board such that the entire printed circuit board defines a rigid printed circuit board;

wherein the rigid insulating layer has a tensile strength that is greater than the tensile strength of the strain resistant layer.

20. The device of claim 19, wherein the strain resistant cap layer comprises ductility in the range of about 15-35%.

21. The device of claim 20, wherein the strain resistant cap layer comprises ductility in the range of about 15-20%.

22. The device of claim 19, wherein the rigid insulating layer is laminated to the strain resistant layer without a bonding layer.

* * * * *

UNITED STATES PATENT AND TRADEMARK OFFICE

CERTIFICATE OF CORRECTION

PATENT NO. : 8,188,373 B2
APPLICATION NO. : 12/329488
DATED : May 29, 2012
INVENTOR(S) : Christopher Hunrath It is certified that error appears in the above-identified patent and that said Letters Patent is hereby corrected as shown below:

1. Column 7, Line 39, Change “as” to --at--.
2. Column 20, Line 39, Change “180° C.” to --180° C.)--.
3. Column 21, Line 26, Change “CTE, XY” to --CTE X,Y--.
4. Column 21, Line 26, Change “CTE, XY” to --CTE X,Y--.
5. Column 22, Line 27, Change “theses” to --these--.
6. Column 22, Line 31, Change “450,450a” to --450, 450a--.
7. Column 25, Line 29, In Claim 6, change “26.000-” to --26,000- --.

Signed and Sealed this
Sixth Day of November, 2012

David J. Kappos

David J. Kappos
*Director of the United States Patent and Trademark Office*